US012072507B2

(12) United States Patent
Wakabayashi et al.

(10) Patent No.: US 12,072,507 B2
(45) Date of Patent: Aug. 27, 2024

(54) LASER RADIATION SYSTEM

(71) Applicants: Gigaphoton Inc., Tochigi (JP); KYUSHU UNIVERSITY, NATIONAL UNIVERSITY CORPORATION, Fukuoka (JP)

(72) Inventors: Osamu Wakabayashi, Oyama (JP); Hiroshi Ikenoue, Fukuoka (JP); Hiroaki Oizumi, Oyama (JP)

(73) Assignees: Gigaphoton Inc., Tochigi (JP); Kyushu University, National University Corporation, Fukuoka (JP)

( * ) Notice: Subject to any disclaimer, the term of this patent is extended or adjusted under 35 U.S.C. 154(b) by 1129 days.

(21) Appl. No.: 16/855,554

(22) Filed: Apr. 22, 2020

(65) Prior Publication Data

US 2020/0251359 A1   Aug. 6, 2020

Related U.S. Application Data

(63) Continuation of application No. PCT/JP2017/045970, filed on Dec. 21, 2017.

(51) Int. Cl.
  *G02B 27/09*  (2006.01)
  *B23K 26/064*  (2014.01)
  (Continued)

(52) U.S. Cl.
  CPC ........ *G02B 27/0933* (2013.01); *B23K 26/064* (2015.10); *B23K 26/0732* (2013.01);
  (Continued)

(58) Field of Classification Search
  CPC ......... H01L 21/02348; H01L 21/02354; H01L 21/268; H01L 21/428; G02B 27/0933
  See application file for complete search history.

(56) References Cited

U.S. PATENT DOCUMENTS

| 5,871,826 A | 2/1999 | Mei et al. |
| 2004/0110335 A1 | 6/2004 | Jyumonji |

(Continued)

FOREIGN PATENT DOCUMENTS

| JP | H0555259 A | 3/1993 |
| JP | H08139048 A | 5/1996 |

(Continued)

OTHER PUBLICATIONS

Machine translation of KR20080077794 A, Nov. 2023 (Year: 2023).*

(Continued)

*Primary Examiner* — Geoffrey S Evans
(74) *Attorney, Agent, or Firm* — Studebaker & Brackett PC

(57) ABSTRACT

A laser radiation optical system for laser doping and post-annealing, the laser radiation system including A. a laser apparatus configured to generate pulsed laser light that belongs to an ultraviolet region, B. a stage configured to move a radiation receiving object in an at least one scan direction, the radiation receiving object being an impurity source film containing at least an impurity element as a dopant and formed on a semiconductor substrate, and C. an optical system including a beam homogenizer configured to shape the beam shape of the pulsed laser light into a rectangular shape and generate a beam for laser doping and a beam for post-annealing that differ from each other in terms of a first beam width in the scan direction but have the same second beam width perpendicular to the scan direction.

19 Claims, 33 Drawing Sheets

(51) Int. Cl.
  *B23K 26/073*  (2006.01)
  *B23K 26/08*  (2014.01)
  *B23K 26/082*  (2014.01)
  *B23K 26/352*  (2014.01)
  *C23C 14/18*  (2006.01)
  *C23C 14/48*  (2006.01)
  *C23C 14/54*  (2006.01)
  *G02B 27/14*  (2006.01)
  *H01L 21/268*  (2006.01)
  *H01L 21/67*  (2006.01)
  *H01S 3/00*  (2006.01)
  *H01L 21/04*  (2006.01)
  *H01L 29/16*  (2006.01)
  *H01L 29/167*  (2006.01)
  *H01S 3/034*  (2006.01)
  *H01S 3/038*  (2006.01)
  *H01S 3/10*  (2006.01)
  *H01S 3/225*  (2006.01)

(52) U.S. Cl.
  CPC ........ *B23K 26/082* (2015.10); *B23K 26/0876* (2013.01); *B23K 26/352* (2015.10); *C23C 14/18* (2013.01); *C23C 14/48* (2013.01); *C23C 14/54* (2013.01); *G02B 27/0961* (2013.01); *G02B 27/0966* (2013.01); *G02B 27/14* (2013.01); *H01L 21/67115* (2013.01); *H01S 3/005* (2013.01); *H01L 21/0455* (2013.01); *H01L 29/1608* (2013.01); *H01L 29/167* (2013.01); *H01S 3/034* (2013.01); *H01S 3/038* (2013.01); *H01S 3/10069* (2013.01); *H01S 3/225* (2013.01)

(56) References Cited

U.S. PATENT DOCUMENTS

2016/0247681 A1 8/2016 Ikeda et al.
2017/0365475 A1 12/2017 Ohkubo et al.

FOREIGN PATENT DOCUMENTS

| JP | H08264468 A | | 10/1996 |
| JP | H1050624 A | | 2/1998 |
| JP | 2004006703 A | | 1/2004 |
| JP | 2010212530 A | | 9/2010 |
| JP | 2016157911 A | | 9/2016 |
| KR | 20080077794 A | * | 8/2008 |
| WO | 2016151723 A1 | | 9/2016 |

OTHER PUBLICATIONS

International Search Report issued in PCT/JP2017/045970; mailed Mar. 20, 2018.

International Preliminary Report On Patentability and Written Opinion issued in PCT/JP2017/045970; issued Jun. 23, 2020.

An Office Action; "Notice of Reasons for Refusal", mailed by the Japanese Patent Office on Nov. 1, 2021, which corresponds to Japanese Patent Application No. 2019-559968 and is related to U.S. Appl. No. 16/855,554; with English language translation.

* cited by examiner

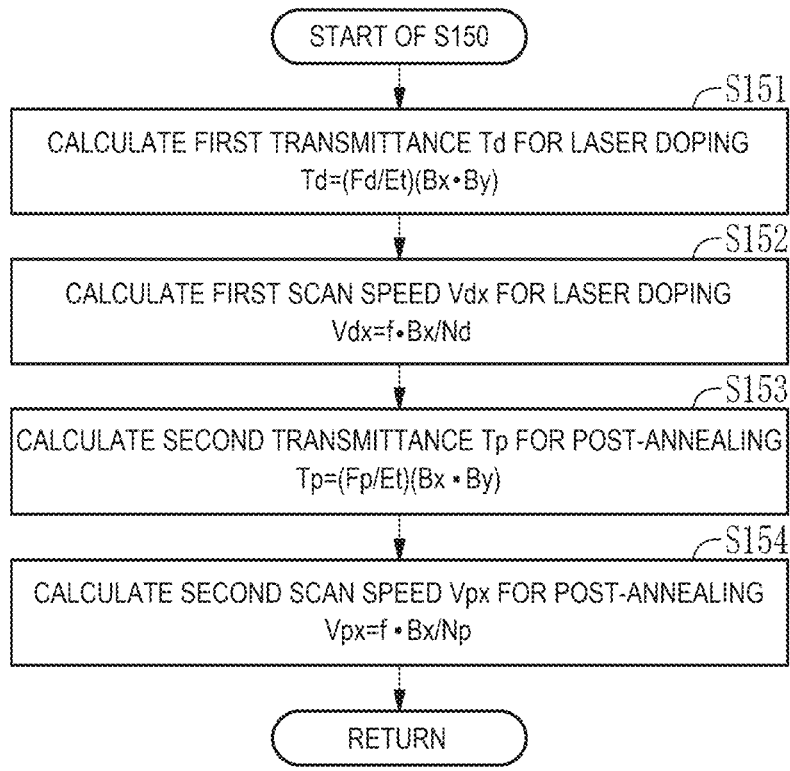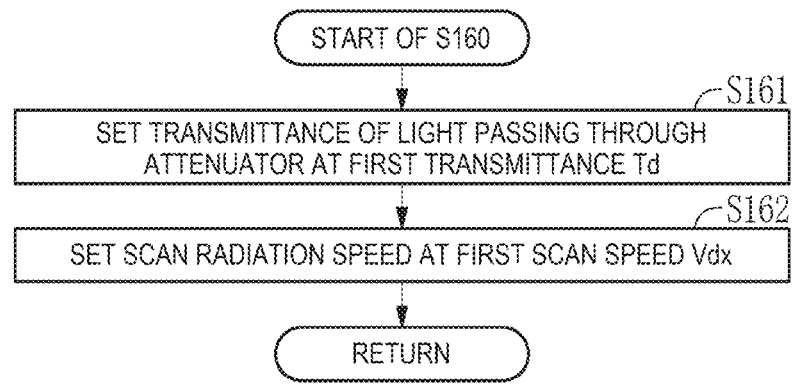

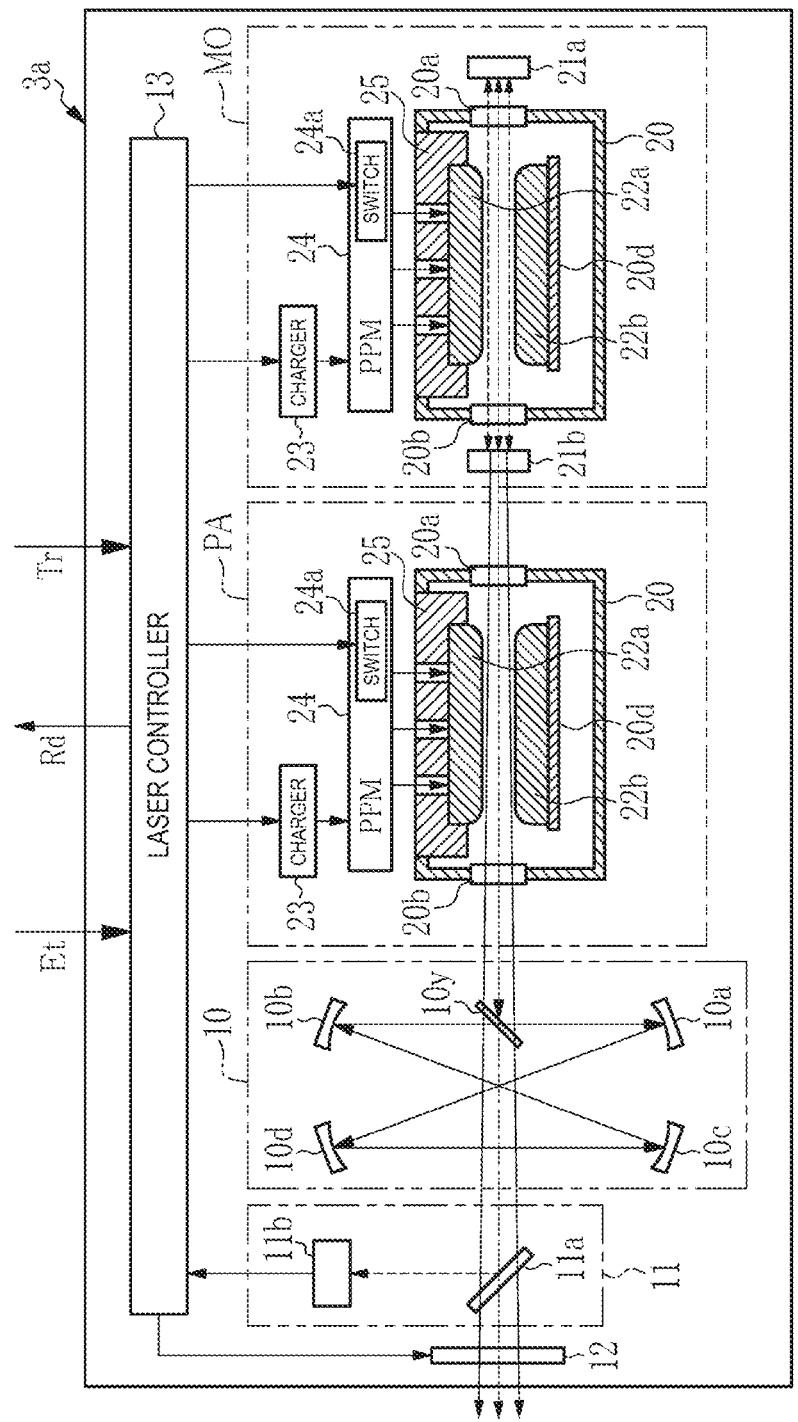

→ # LASER RADIATION SYSTEM

CROSS-REFERENCE TO RELATED APPLICATIONS

The present application is a continuation application of International Application No. PCT/JP2017/045970, filed on Dec. 21, 2017, the entire contents of which are hereby incorporated by reference.

BACKGROUND

1. Technical Field

The present disclosure relates to a laser radiation system.

2. Related Art

A semiconductor is a material that forms an active element, such as an integrated circuit, a power device, a light-emitting diode (LED), a liquid crystal display, an organic electro-luminescence (EL) display, and is a material essential to manufacture an electronic device. To manufacture such an active element, it is necessary to dope an impurity as a dopant into a semiconductor substrate and then activate the impurity to achieve n-type or p-type electric characteristics of the impurity.

In general, an impurity is doped into a semiconductor substrate and activated in the semiconductor by using thermal diffusion and ion injection. The thermal diffusion is a method for thermally diffusing an impurity in a semiconductor substrate via the surface thereof and further activating the impurity by heating the substrate to a high temperature in a gas containing the impurity.

The ion injection includes an ion injection step and a thermal annealing step. The ion injection step is the step of injecting the impurity into the semiconductor substrate by irradiating the semiconductor substrate with an impurity ion beam accelerated to a high speed. The thermal annealing step is the step of repairing defects in the semiconductor substrate that result from the impurity injection and activating the impurity by imparting thermal energy to the semiconductor substrate. The ion injection has excellent characteristics, for example, allows an ion injection region to be locally set by using a mask, such as a resist, and accurate control of the depth of the impurity concentration. The ion injection is therefore widely used as a technology for manufacturing an integrated circuit using silicon (Si).

Silicon carbide (SiC) is being developed as a material of a next-generation power device. SiC has a wide bandgap, dielectric breakdown electric field characteristics about 10 times better than those of Si, excellent thermal conductivity, and other properties as compared with Si used as a semiconductor material in related art. SiC is further characterized by thermochemical stability.

To form a transistor by using SiC, an impurity needs to be doped into the SiC. Doping an impurity by using related-art ion injection used to form an Si-based transistor, however, has a problem of thermal damage of SiC, resulting in defects, which lower the electric characteristics of the transistor.

To address the problem, laser doping has been studied as the method for doping an impurity into SiC. The laser doping is a method for forming an impurity source film containing a dopant on the surface of a semiconductor substrate and irradiating the impurity source film with laser light to introduce the impurity contained in the impurity source film into the semiconductor substrate.

CITATION LIST

Patent Literature

[PTL 1] JP-A-5-55259
[PTL 2] JP-A-8-139048
[PTL 3] JP-A-8-264468
[PTL 4] US Patent Publication No. 2016/0247681

SUMMARY

A laser radiation system for laser doping and post-annealing according to a viewpoint of the present disclosure includes:

A. a laser apparatus configured to generate pulsed laser light that belongs to an ultraviolet region, B. a stage configured to move a radiation receiving object in an at least one scan direction, the radiation receiving object being an impurity source film containing at least an impurity element as a dopant and formed on a semiconductor substrate, and C. an optical system including a beam homogenizer configured to shape a beam shape of the pulsed laser light into a rectangular shape and generate a beam for laser doping and a beam for post-annealing that differ from each other in terms of a first beam width in the scan direction but have the same second beam width perpendicular to the scan direction.

BRIEF DESCRIPTION OF THE DRAWINGS

Embodiments of the present disclosure will be described below only by way of example with reference to the accompanying drawings.

FIG. 8 shows a subroutine illustrating the details of the process of calculating parameters for laser doping and post-annealing.

FIG. 9 shows a subroutine illustrating the details of the process of setting the parameters for laser doping.

FIG. 39 shows a variation of the laser apparatus.

DETAILED DESCRIPTION

Figure 1:
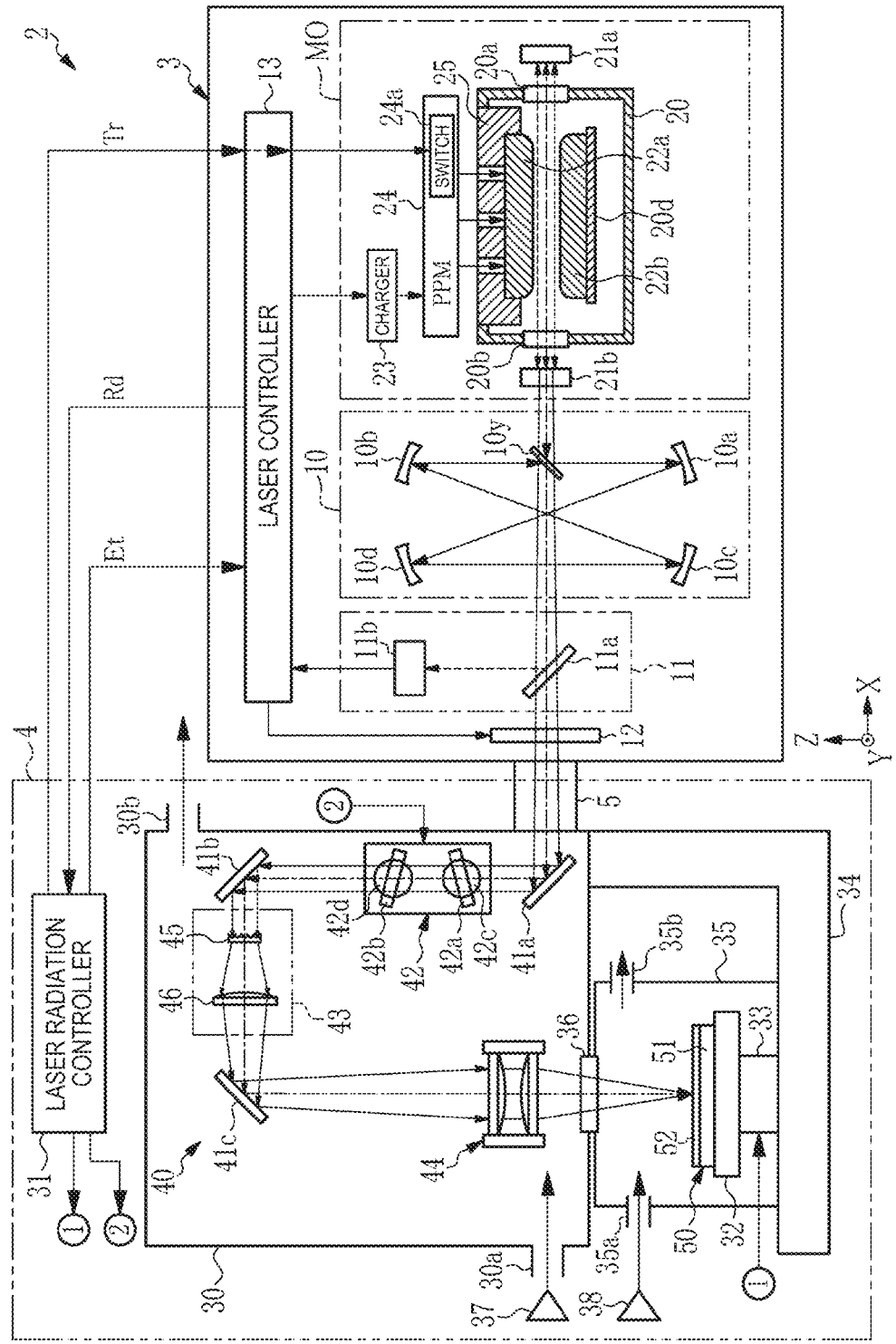
FIG. 1 schematically shows the configuration of a laser radiation system according to Comparative Example.

<Contents>
1. Overview
2. Comparative Example
2.1 Configuration
2.2 Configuration of fly-eye lens
2.3 Scan radiation control
2.4 Set value of fluence of pulsed laser light
2.5 Set value of transmittance of light passing through attenuator
2.6 Operation of laser radiation system
2.6.1 Main procedure
2.6.2 Details of S110
2.6.3 Details of S120
2.6.4 Details of S150
2.6.5 Details of S160
2.6.6. Details of S210
2.6.7 Details of S170
2.7 Problems
3. First embodiment
3.1 Configuration
3.2 Operation of laser radiation system
3.2.1 Main procedure
3.2.2 Details of S350
3.2.3 Details of S360
3.2.4 Details of S420
3.2.5 Details of S370
3.3 Effects
4. Second embodiment
4.1 Configuration
4.2 Method for setting second beam width
4.3 Operation of laser radiation system
4.3.1 Main procedure
4.3.2 Details of S350'
4.3.3 Details of S360'
4.3.4 Details of S420'
4.3.5 Details of S370'
4.4 Effects
5. First variation
5.1 Scan radiation control
5.2 Operation of laser radiation system
5.3 Effects
6. Second variation
7. Third embodiment
7.1 Configuration
7.2 Scan radiation control
7.3 Method for setting reflectance
7.4 Operation of laser radiation system
7.4.1 Main procedure
7.4.2 Details of S750
7.4.3 Details of S760
7.5 Effects
8. Fourth embodiment
8.1 Configuration
8.2 Operation
8.3 Effects
9. Variation of laser apparatus
10. Other variations Embodiments of the present disclosure will be described below in detail with reference to the drawings. The embodiments described below show some examples of the present disclosure and are not intended to limit the contents of the present disclosure. Further, all configurations and operations described in the embodiments are not necessarily essential as configurations and operations in the present disclosure. The same component has the same reference character, and no redundant description of the same component will be made.

1. Overview

The present disclosure relates to a laser radiation system configured to dope an impurity into a semiconductor substrate and perform post-annealing for activation of the impurity by irradiating a radiation receiving object that is an impurity source film formed on the semiconductor substrate with pulsed laser light.

2. Comparative Example

2.1 Configuration of laser radiation system

FIG. 1 schematically shows the configuration of a laser radiation system 2 according to Comparative Example. The laser radiation system 2 includes a laser apparatus 3 and a laser radiation apparatus 4. The laser apparatus 3 and the laser radiation apparatus 4 are connected to each other via an optical path tube 5.

The laser apparatus 3 includes a master oscillator MO, an optical pulse stretcher (OPS) 10, a monitor module 11, a shutter 12, and a laser controller 13. The laser apparatus 3 is a discharge-excitation-type laser apparatus configured to generate pulsed laser light that belongs to the ultraviolet region by using a laser gas containing $F_2$, KrF, ArF, XeCl, or XeF as a laser medium.

When the laser apparatus 3 is an $F_2$ laser apparatus, the center wavelength of the pulsed laser light is about 157 nm. When the laser apparatus 3 is an ArF excimer laser apparatus, the center wavelength of the pulsed laser light is about 193.4 nm. When the laser apparatus 3 is a KrF excimer laser apparatus, the center wavelength of the pulsed laser light is about 248.4 nm. When the laser apparatus 3 is a XeCl excimer laser apparatus, the center wavelength of the pulsed laser light is about 308 nm. When the laser apparatus 3 is a XeF excimer laser apparatus, the center wavelength of the pulsed laser light is about 351 nm.

The master oscillator MO includes a laser chamber 20, the combination of a rear mirror 21a and an output coupler 21b, a charger 23, and a pulse power module (PPM) 24. FIG. 1 shows the internal configuration of the laser chamber 20 viewed along a direction substantially perpendicular to the traveling direction of the laser light.

The laser chamber 20 is a chamber configured to encapsulate the laser gas, and a pair of electrodes 22a and 22b are disposed in the laser chamber 20. The pair of electrodes 22a and 22b are discharge electrodes configured to excite the laser medium by using discharge that occurs between the electrodes.

The laser chamber 20 has an opening formed therein, and an electric insulator 25 closes the opening. The electrode 22a is supported by the electric insulator 25, and the electrode 22b is supported by a return plate 20d. The return plate 20d is connected to the inner surface of the laser chamber 20 via wiring that is not shown. An electric conductor is buried in the electric insulator 25. The electric conductor is configured to apply high voltage supplied from the PPM 24 to the electrode 22a.

The charger 23 is a DC power source configured to charge a charging capacitor that is not shown but is provided in the PPM 24 with predetermined voltage. The PPM 24 includes a switch 24a controlled by the laser controller 13. When the state of the switch 24a transitions from the OFF-state to the ON state, the PPM 24 produces pulsed high voltage from the electric energy held in the charger 23 and applies the high voltage to the space between the pair of electrodes 22a and 22b.

When the high voltage is applied to the space between the pair of electrodes 22a and 22b, dielectric breakdown occurs in the space between the pair of electrodes 22a and 22b, followed by discharge. The energy of the discharge excites the laser medium in the laser chamber 20, and the laser medium transitions to a high energy level. The excited laser medium then transitions to a lower energy level, and the laser medium emits light according to the difference between the energy levels.

Windows 20a and 20b are provided at opposite ends of the laser chamber 20. The light generated in the laser chamber 20 exits out of the laser chamber 20 via the windows 20a and 20b.

The rear mirror 21a and the output coupler 21b form an optical resonator. The rear mirror 21a is coated with a high-reflectance film, and the output coupler 21b is coated with a partial reflection film. The laser chamber 20 is disposed in the optical path of the optical resonator. The rear mirror 21a is therefore configured to reflect the light having exited out of the laser chamber 20 via the window 20a at high reflectance and cause the reflected light to return into the laser chamber 20 via the window 20a. The output coupler 21b is configured to transmit part of the light having exited out of the laser chamber 20 via the window 20b and reflect the remainder of the light back into the laser chamber 20.

The light having exited out of the laser chamber 20 thus travels back and forth between the rear mirror 21a and the output coupler 21b and is amplified whenever passing through the discharge space between the electrodes 22a and 22b. Part of the amplified light exits as the pulsed laser light via an output coupler 24.

The OPS 10 includes a beam splitter 10y and concave mirrors 10a to 10d. The OPS 10 is so disposed that the beam splitter 10y is located in the optical path of the pulsed laser light outputted from the master oscillator MO. The concave mirrors 10a to 10d form a delay optical system.

The concave mirrors 10a to 10d are each a concave mirror having substantially the same focal length F. For example, the focal length F corresponds to the distance from the beam splitter 10y to the concave mirror 10a. The concave mirrors 10a to 10d are configured to guide the light partially reflected off the beam splitter 10y to the beam splitter 10y and erectly transfer the light to the beam splitter 10y. The OPS 10 is configured to stretch the pulses of the pulsed laser light inputted from the master oscillator MO and output pulsed laser light having an extended pulse period width.

The monitor module 11 is disposed in the optical path of the pulsed laser light having exited out of the master oscillator MO. For example, the monitor module 11 includes a beam splitter 11a and an optical sensor 11b. The beam splitter 11a is configured to transmit the pulsed laser light outputted from the OPS 10 at high transmittance toward the shutter 12 and reflect part of the pulsed laser light toward the optical sensor 11b. The optical sensor 11b is configured to detect the pulse energy of the pulsed laser light incident thereon and output data on the detected pulse energy to the laser controller 13.

The laser controller 13 is configured to transmit and receive a variety of signals to and from a laser radiation controller 31, which is provided in the laser radiation apparatus 4. The laser controller 13 is configured to receive a light emission trigger Tr, target pulse energy Et, and other data from the laser radiation controller 31. The laser controller 13 is configured to transmit a charging voltage setting signal to the charger 23 and transmit a signal configured to turn on or off the switch 24a to the PPM 24.

The laser controller 13 is configured to receive the pulse energy data from the monitor module 11 and refer to the received pulse energy data to control the charging voltage provided by the charger 23. Controlling the charging voltage provided by the charger 23 allows control of the pulse energy of the pulsed laser light.

The shutter 12 is disposed in the optical path of the pulsed laser light having passed through the beam splitter 11a of the monitor module 11. The laser controller 13 is configured to close the shutter 12 after the laser oscillation starts but before the difference between the pulse energy received from the monitor module 11 and the target pulse energy Et falls within an acceptable range. When the difference between the pulse energy received from the monitor module 11 and the target pulse energy Et falls within the acceptable range, the laser controller 13 opens the shutter 12. The laser controller 13 is configured to transmit a preparation completion signal Rd, which represents that the light emission trigger Tr, which triggers the pulsed laser light, is receivable, to the laser radiation controller 31 in synchronization with a signal configured to open the shutter 12.

The laser radiation apparatus 4 includes an enclosure 30, the laser radiation controller 31, a table 32, an XYZ stage 33, a frame 34, a radiation shield 35, and an optical system 40. The optical system 40 is disposed in the enclosure 30. The enclosure 30, the XYZ stage 33, and the radiation shield 35 are fixed to the frame 34.

A radiation receiving object 50, which is irradiated with the pulsed laser light from the laser radiation apparatus 4, is placed on the table 32. The radiation receiving object 50 is made of a semiconductor material used to form a power device, such as SiC, diamond, and GaN. SiC does not necessarily have a specific crystal structure and is, for example, 4H—SiC. The radiation receiving object 50 includes a semiconductor substrate 51, which is made of any of the semiconductor materials described above, and an impurity source film 52, which is formed on the surface of the semiconductor substrate 51. The impurity source film 52 is a film containing at least an impurity element as a dopant.

To convert the semiconductor substrate 51 into a p-type semiconductor substrate in the doping process, an aluminum metal film containing the aluminum element as the p-type dopant is, for example, used as the impurity source film 52. To convert the semiconductor substrate 51 into an n-type semiconductor substrate in the doping process, for example, a nitride film containing the nitrogen element as the n-type dopant, such as an SiN film, is used as the impurity source film 52.

The XYZ stage 33 is configured to movably support the table 32. The XYZ stage 33 is configured to move the table 32 in axis-X, axis-Y, and axis-Z directions in accordance with a control signal inputted from the laser radiation controller 31. The XYZ stage 33 is configured to change the position of the table 32 in the axis-X or axis-Y direction to move a region of the surface of the radiation receiving object 50 that is the region irradiated with the pulsed laser light. The axis-Z direction is parallel to the optical axis of the pulsed laser light outputted from the optical system 40. The axis-X and axis-Y directions are perpendicular to each other and are each perpendicular to the axis-Z direction.

The optical system 40 includes high-reflectance mirrors 41a to 41c, an attenuator 42, a beam homogenizer 43, and a transfer optical system 44. The high-reflectance mirrors 41a to 41c are configured to reflect the pulsed laser light, which belongs to the ultraviolet region, at high reflectance. The high-reflectance mirror 41a is so disposed that the high-reflectance mirror 41a reflects the pulsed laser light incident from the laser apparatus 3 via the optical path tube 5 and the reflected pulsed laser light passes through the attenuator 42 and is incident on the high-reflectance mirror 41b. The high-reflectance mirrors 41a to 41c are each formed, for example, of a transparent substrate made of synthetic quartz or calcium fluoride ($CaF_2$) crystal and having a surface coated with a reflection film configured to reflect the pulsed laser light at high reflectance.

The attenuator 42 is disposed in the optical path between the high-reflectance mirrors 41a and 41b. The attenuator 42 includes two partial reflection mirrors 42a and 42b and rotary stages 42c and 42d. The rotary stage 42c is configured to hold and rotate the partial reflection mirror 42a to change the angle of incidence of the pulsed laser light incident on the partial reflection mirror 42a. The rotary stage 42d is configured to hold and rotate the partial reflection mirror 42b to change the angle of incidence of the pulsed laser light incident on the partial reflection mirror 42b.

The partial reflection mirrors 42a and 42b are each an optical element having transmittance that changes in accordance with the angle of incidence of the pulsed laser light. The rotary stages 42c and 42d are configured to adjust the inclination angle of the partial reflection mirrors 42a and 42b in such a way that the angles of incidence of the pulsed laser light incident on the partial reflection mirrors 42a and 42b coincide with each other and the partial reflection mirrors 42a and 42b have desired transmittance.

The rotary stages 42c and 42d are driven by control signals inputted from the laser radiation controller 31 to control the transmittance of the attenuator 42. The pulsed laser light having entered the attenuator 42 is attenuated in accordance with the transmittance controlled by the control signals and exits out of the attenuator 42.

The high-reflectance mirror 41b is so disposed that the pulsed laser light incident from the attenuator 42 is reflected off the high-reflectance mirror 41b and the reflected pulsed laser light passes through the beam homogenizer 43 and is incident on the high-reflectance mirror 41c.

The beam homogenizer 43 is disposed in the optical path between the high-reflectance mirrors 41b and 41c. The beam homogenizer 43 includes a fly-eye lens 45 and a condenser lens 46. The fly-eye lens 45 is disposed on the upstream of the condenser lens 46. The pulsed laser light incident from the high-reflectance mirror 41b passes through the fly-eye lens 45 and the condenser lens 46, which are configured to convert the pulsed laser light into Koehler illumination light in the focal plane of the condenser lens 46, and the Koehler illumination light has an optical intensity distribution homogenized in a predetermined beam shape. The fly-eye lens 45 shapes the beam shape of the pulsed laser light in a cross section perpendicular to the optical axis thereof into a rectangular shape. The pulsed laser light having exited out of the fly-eye lens 45 passes through the condenser lens 46, the focal plane of which is illuminated with the pulsed laser light in the form of Koehler illumination, and the pulsed laser light is incident on the high-reflectance mirror 41c.

The transfer optical system 44 is disposed in the optical path of the pulsed laser light reflected off the high-reflectance mirror 41c. The transfer optical system 44 is formed of the combination of a plurality of lenses. The transfer optical system 44 may be a reduction projection optical system. The transfer optical system 44 is configured to transfer the rectangular beam formed by the beam homogenizer 43 onto the surface of the radiation receiving object 50 via a window 36.

The window 36 is disposed in the optical path between the transfer optical system 44 and the radiation receiving object 50 and fixed to an opening formed in the enclosure 30 with the gap between the window 36 and the opening sealed with an O ring that is not shown. The window 36 is a transparent substrate made of synthetic quartz or $CaF_2$ crystal, and the opposite surfaces of the window 36 may each be coated with a reflection suppression film.

The enclosure 30 is provided with an intake port 30a, via which a first purge gas is sucked into the enclosure 30, and a discharge port 30b, via which the first purge gas is discharged out of the enclosure 30. For example, the first purge gas is nitrogen ($N_2$) gas. An intake tube and a discharge tube that are not shown are connected to the intake port 30a and the discharge port 30b, respectively. The gaps between the intake port 30a and the intake tube connected thereto and between the discharge port 30b and the discharge tube connected thereto are each so sealed with an O ring that is not shown that contamination in the enclosure 30 due to outside air is suppressed. A first purge gas supply source 37, which supplies the first purge gas, is connected to the intake port 30a. The first purge gas purges the interior of the enclosure 30.

The portion where the optical path tube 5 is connected to the laser radiation apparatus 4 and portion where the optical path tube 5 is connected to the laser apparatus 3 are each so configured that the gap between the optical path tube 5 and the apparatus is sealed with an O ring that is not shown. The first purge gas purges the interior of the optical path tube 5.

The radiation shield 35 is configured to surround the radiation receiving object 50 supported by the table 32. The radiation shield 35 is so sized as to surround the entire table 32 and XYZ stage 33 and is fixed to the frame 34. An opening connected to the window 36 provided in the enclosure 30 is formed in the upper surface of the radiation shield 35. The gap between the opening and the window 36 is sealed with an O ring that is not shown.

The radiation shield 35 is configured to be capable of filling the portion between the window 36 and the radiation receiving object 50 with a second purge gas. The radiation shield 35 is provided with an intake port 35a, via which the second purge gas is sucked into the radiation shield 35, and a discharge port 35b, via which the second purge gas is discharged out of the radiation shield 35. The second purge gas is an inert gas hardly containing oxygen and is, for example, argon gas (Ar) or helium gas (He). The second purge gas may be an inert gas having oxygen concentration that does not produce any oxide on the semiconductor surface when the semiconductor material is irradiated with the laser light. A second purge gas supply source 38, which supplies the second purge gas, is connected to the intake port 35a. The second purge gas purges the interior of the radiation shield 35.

The laser radiation controller 31 is configured to output the light emission trigger Tr at a predetermined repetitive frequency f to the laser controller 13. The master oscillator MO is configured to accordingly perform the laser oscillation at the repetitive frequency f. The laser radiation controller 31 includes a storage that is not shown but is configured to store a first radiation condition under which a beam for laser doping is radiated and a second radiation condition under which a beam for post annealing is radiated.

The first radiation condition contains fluence Fd and the number of radiated pulses Nd of the beam for laser doping, which is the pulsed laser light with which the radiation receiving object 50 is irradiated in the laser doping. The second radiation condition contains fluence Fp and the number of radiated pulses Np of the beam for post-annealing, which is the pulsed laser light with which the radiation receiving object 50 is irradiated in the post-annealing. The fluence Fd is hereinafter referred to as first fluence Fd. The number of radiated pulses Nd is referred to as a first number of radiated pulses Nd. The fluence Fp is hereinafter referred to as second fluence Fp. The number of radiated pulses Np is referred to as a second number of radiated pulses Np. The first and second radiation conditions stored in the storage can be overwritten as appropriate by an external apparatus that is not shown.

The laser radiation controller 31 is configured to control the XYZ stage 33 in the laser doping and the post-annealing to perform scanning radiation in which the radiation receiving object 50 is radiated with the pulsed laser light while moving the radiation receiving object 50 in the plane XY. The laser radiation controller 31 is configured to calculate first transmittance Td of light passing through the attenuator 42 and a first scan speed Vdx, which are set in the laser doping, based on the first radiation condition. The laser radiation controller 31 is further configured to calculate second transmittance Tp of light passing through the attenuator 42 and a second scan speed Vpx, which are set in the post-annealing, based on the second radiation condition. Details of the above will be described below.

2.2 Configuration of Fly-Eye Lens

Figure 2:
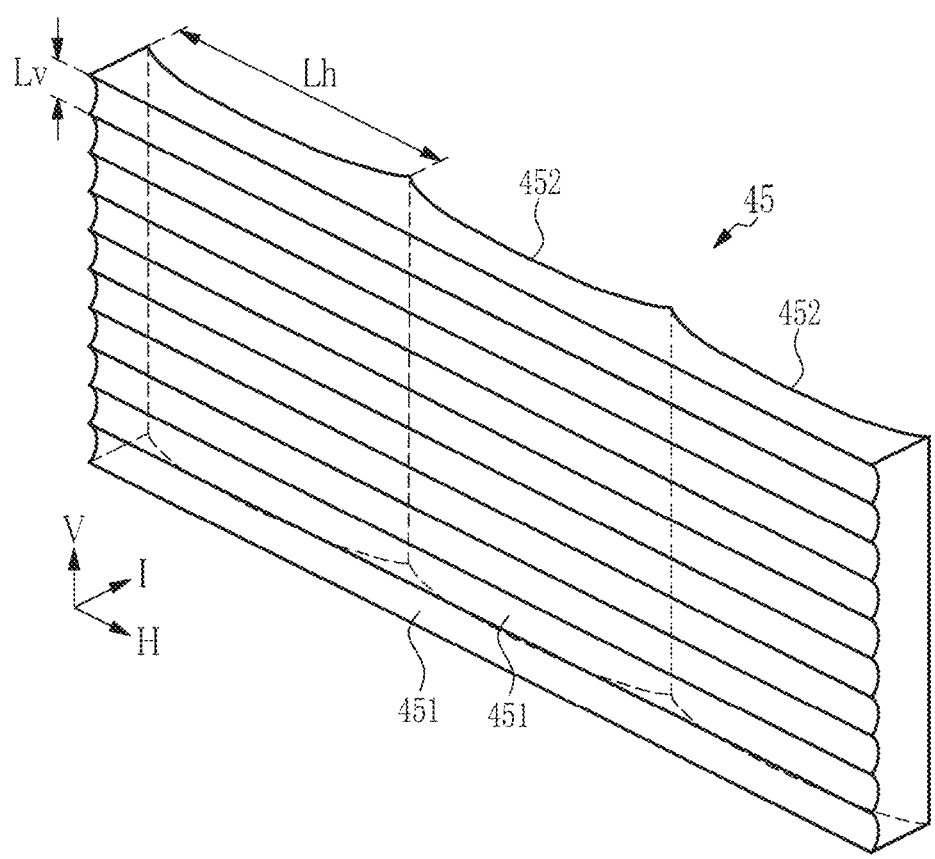
FIG. 2 is a perspective view showing the configuration of a fly-eye lens.

The configuration of the fly-eye lens 45 provided in the beam homogenizer 43 will next be described. FIG. 2 shows the configuration of the fly-eye lens 45. In FIG. 2, an axis-I direction represents the traveling direction of the pulsed laser light. Axis-V and axis-H directions are perpendicular to each other and further perpendicular to the traveling direction of the pulsed laser light.

The fly-eye lens 45 is formed by processing a transparent substrate made of synthetic quartz or calcium fluoride ($CaF_2$) crystal. A plurality of first concave cylindrical surface 451 each having a first radius of curvature in the axis-V direction and extending in the axis-H direction are arranged in the axis-V direction at first intervals Lv on a first surface of the fly-eye lens 45 that is the surface on which the pulsed laser light is incident. A plurality of second concave cylindrical surface 452 each having a second radius of curvature in the axis-H direction and extending in the axis-V direction are arranged in the axis-H direction at second intervals Lh on a second surface of the fly-eye lens 45 that is the surface opposite the first surface. The first interval Lv is smaller than the second interval Lh.

The first radius of curvature of the first cylindrical surfaces 451 and the second radius of curvature of the second cylindrical surfaces 452 are so set that the focal position of the concave lens formed by the first cylindrical surface 451 substantially coincides with the focal position of the concave lens formed by the second cylindrical surface 452.

When the pulsed laser light is incident on the fly-eye lens 45, a secondary light source as a planar light source is produced in the focal positions of the first cylindrical surfaces 451 and the second cylindrical surfaces 452. The condenser lens 46 is configured to cause the pulsed laser light having exited out of the fly-eye lens 45 to form Koehler illumination in the position of the focal plane of the condenser lens 46. The beam shape at the region illuminated with the Koehler illumination is the shape of one lens that forms the fly-eye lens 45, that is, a shape similar to the oblong having the length of Lv in the axis-V direction and the length of Lh in the axis-H direction. That is, the beam shape of the pulsed laser light in a cross section perpendicular to the optical axis is shaped by the beam homogenizer 43 into a rectangular shape.

2.3 Scan Radiation Control

Figure 3A:
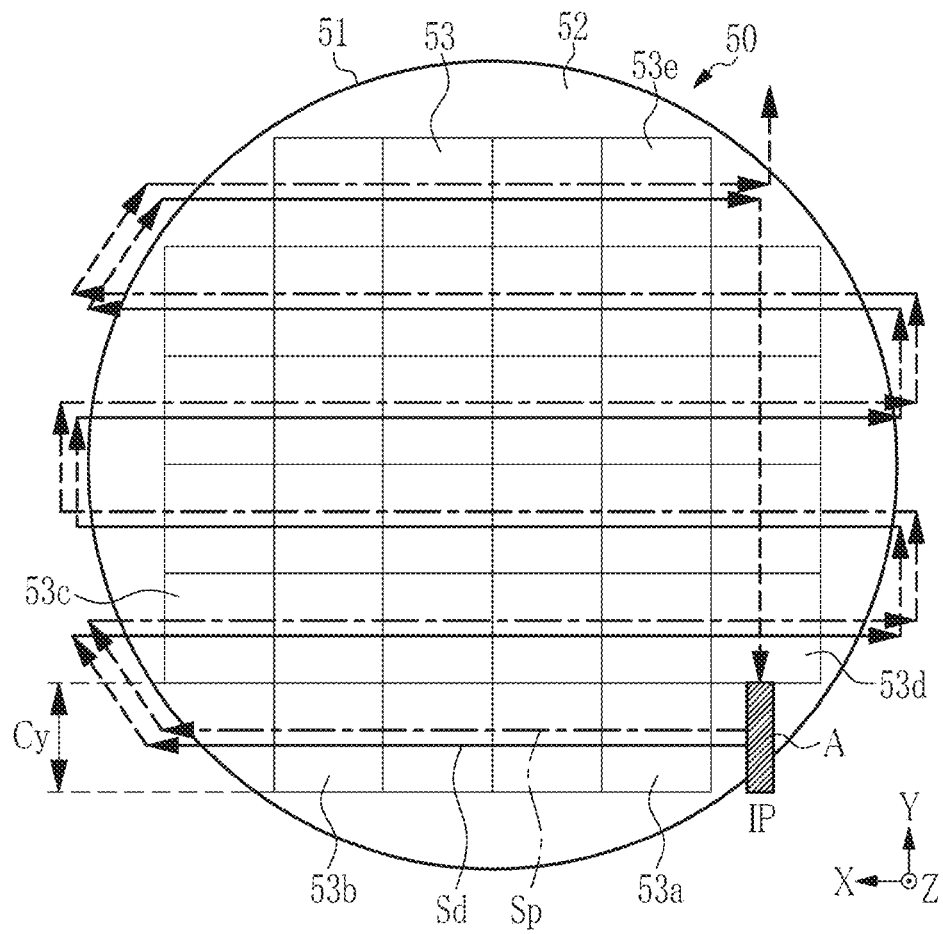
FIG. 3A is a plan view of a radiation receiving object in the form of a wafer.

Scan radiation control performed by the laser radiation controller 31 will next be described. FIG. 3A shows the radiation receiving object 50, which is the semiconductor substrate 51 described before in the form of a wafer. A plurality of chip formation regions 53 are two-dimensionally arranged on the semiconductor substrate 51 in the axis-X and axis-Y directions. The chip formation regions 53 each have a rectangular shape.

Figure 3B:
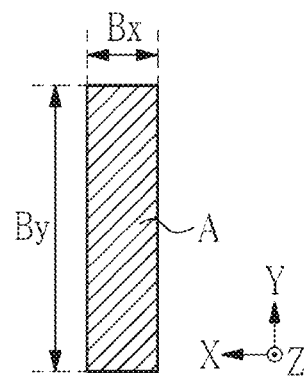
FIG. 3B shows the shape of an irradiated region.

In FIG. 3A, reference character A represents the beam shape of the pulsed laser light which exits out of the beam homogenizer 43 and travels through the high-reflectance mirror 41*c* and the transfer optical system 44 and with which the radiation receiving object 50 is irradiated, that is the irradiated region. The irradiated region A has a rectangular shape and has a first beam width Bx in the axis-X direction and a second beam width By in the axis-Y direction, as shown in FIG. 3B. The second beam width By is greater than the first beam width Bx. That is, the pulsed laser light has a substantially linear beam shape. It is preferable that the second beam width By is greater than the first beam width Bx multiplied by 5 but smaller than the first beam width Bx multiplied by 1000.

The second beam width By is substantially equal to a width Cy of each of the chip formation regions 53 in the axis-Y direction. The width Cy represents the axis-Y-direction minimum width of each of the chip formation regions 53 of the semiconductor substrate 51 that are divided into chips, that is, the dicing interval in the axis-Y direction. The second beam width By is not limited to the width Cy and may be a value that satisfies the following Expression (1).

$$By = n \cdot Cy \quad (1)$$

where n is an integer greater than or equal to 1.

The laser radiation controller 31 is configured to perform the scan radiation by controlling the XYZ stage 33 to linearly move the radiation receiving object 50 at a fixed speed in the axis-X direction relative to the irradiated region A irradiated with the pulsed laser light. The moving speed of the radiation receiving object 50 in the laser doping is the first scan speed Vdx described before, and the moving speed of the radiation receiving object 50 in the post-annealing is the second scan speed Vpx described before. Reference character Sd represents a first scan path in the laser doping. Reference character Sp represents a second scan path in the post-annealing. In the present Comparative Example, the first scan path Sd coincides with the second scan path Sp.

The laser radiation controller 31 is configured to calculate the first scan speed Vdx in such a way that the number of pluses of the pulsed laser light with which the position of each of the chip formation regions 53 is irradiated is equal to the first number of radiated pulses Nd described before. Specifically, the laser radiation controller 31 is configured to use data on the first number of radiated pulses Nd, the repetitive frequency f, and the first beam width Bx to calculate the first scan speed Vdx based on Expression (2) below.

$$Vdx = f \cdot Bx / Nd \quad (2)$$

The laser radiation controller 31 is configured to calculate the second scan speed Vpx in such a way that the number of pluses of the pulsed laser light with which the position of each of the chip formation regions 53 is irradiated is equal to the second number of radiated pulses Np described before. Specifically, the laser radiation controller 31 is configured to use data on the second number of radiated pulses Np, the repetitive frequency f, and the first beam width Bx to calculate the second scan speed Vpx based on Expression (3) below.

$$Vpx = f \cdot Bx / Np \quad (3)$$

To start the laser doping, the laser radiation controller 31 is configured to set the irradiated region A in an initial position IP in the vicinity of a first chip formation region 53*a* located in an end portion of a first row and start the scan radiation toward the positive side of the axis-X direction at the first scan speed Vdx along the first scan path Sd. When the irradiated region A passes through a second chip formation region 53*b* located at the last end of the first row, the laser radiation controller 31 moves the irradiated region A toward the positive side of the axis-Y direction. The laser radiation controller 31 is thereafter configured to perform the scan radiation toward the negative side of the axis-X direction from a third chip formation region 53*c* located in an end portion of a second row. When the irradiated region A passes through a fourth chip formation region 53*d* located at the last end of the second row, the laser radiation controller 31 moves the irradiated region A toward the positive side of the axis-Y direction by one row.

The laser radiation controller 31 is configured to repeatedly perform the scan radiation described above and causes the irradiated region A to return to the initial position IP when the irradiated region A passes through a fifth chip formation region 53*e* located at the last end of the last row. The laser radiation controller 31 is thereafter configured to perform the scan radiation for post-annealing at the second scan speed Vpx along the second scan path Sp.

2.4 Set Value of Fluence of Pulsed Laser Light

The fluence of the pulsed laser light in the laser doping and the post-annealing will next be described. The fluence used herein is the energy density (J/cm$^2$) per pulse of the pulsed laser light on the surface of the radiation receiving object 50. The laser radiation controller 31 is configured to set the first fluence Fd in the laser doping and the second fluence Fp in the post-annealing by controlling the transmittance of light passing through the attenuator 42.

Figure 4:
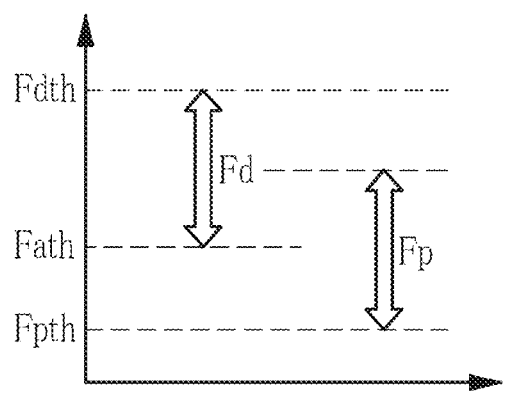
FIG. 4 describes set values of first fluence Fd and second fluence Fp.

FIG. 4 describes set values of the first fluence Fd and the second fluence Fp. The first fluence Fd is so set as to fall within the range that satisfies Expression (4) below.

$$Fath \leq Fd < Fdth \quad (4)$$

Reference character Fath is a fluence threshold that causes ablation in the impurity source film 52 formed on the surface of the semiconductor substrate 51 when the radiation receiving object 50 is irradiated with the pulsed laser light having the first number of radiated pulses Nd. Reference character Fdth is a fluence threshold that causes damage at the surface of the semiconductor substrate 51 when the radiation receiving object 50 is irradiated with the pulsed laser light having the first number of radiated pulses Nd. When the first fluence Fd is so set as to fall within the range expressed by Expression (4) described above, the impurity source film 52 can be ablated, and the impurity can be doped into the semiconductor substrate 51 with no damage at the surface of the semiconductor substrate 51.

The second fluence Fp is in principle preferably so set as to fall within the range that satisfy (5) below and more preferably so set as to fall within the range that satisfy (6) below.

$$F_{pth} \leq F_p < F_{dth} \quad (5)$$

$$F_{pth} \leq F_p < F_d \quad (6)$$

Reference character Fpth is a fluence threshold that allows repair of defects in the semiconductor substrate 51 that result from the doping when the semiconductor substrate 51 having undergone the doping is irradiated with the pulsed laser light having the second number of radiated pulses Np. When the second fluence Fp is so set as to fall within the range expressed by Expression (5) or (6) described above, the post-annealing can be performed to activate the impurity with no damage at the surface of the semiconductor substrate 51.

The first number of radiated pulses Nd and the second number of radiated pulses Np preferably satisfy Expression (7) below.

$$2 \leq Nd < Np \quad (7)$$

2.5 Set value of transmittance of light passing through attenuator

The value at which the transmittance of light passing through the attenuator 42 is so set that the fluence of the pulsed laser light has a predetermined value will next be described. First, let T be the transmittance of light passing through the attenuator 42 and T' be the transmittance of light passing along the optical path from the attenuator 42 to the radiation receiving object 50. Further, let Et be the pulse energy of the pulsed laser light incident on the attenuator 42 and F be the fluence of the pulsed laser light on the surface of the radiation receiving object 50. In this case, the fluence F is expressed by Expression (8) below.

$$F = T \cdot T' \cdot Et/(Bx \cdot By) \quad (8)$$

For example, it is assumed in Comparative Example that the transmittance T' is 100%, that is, T'=1. In this case, the transmittance T of light passing through the attenuator 42 is expressed by the following Expression (9).

$$T = (F/Et)(Bx \cdot By) \quad (9)$$

The laser radiation controller 31 is configured to calculate the first transmittance Td and the second transmittance Tp described before by substituting the first fluence Fd and the second fluence Fp described before into Expression (9) described above. In a case where the transmittance T' is a fixed value smaller than 1, the first transmittance Td and the second transmittance Tp may be calculated based on Expression (10) below.

$$T = (F/Et \cdot T')(Bx \cdot By) \quad (10)$$

2.6 Operation of Laser Radiation System 2.6.1 Main Procedure

Figure 5:
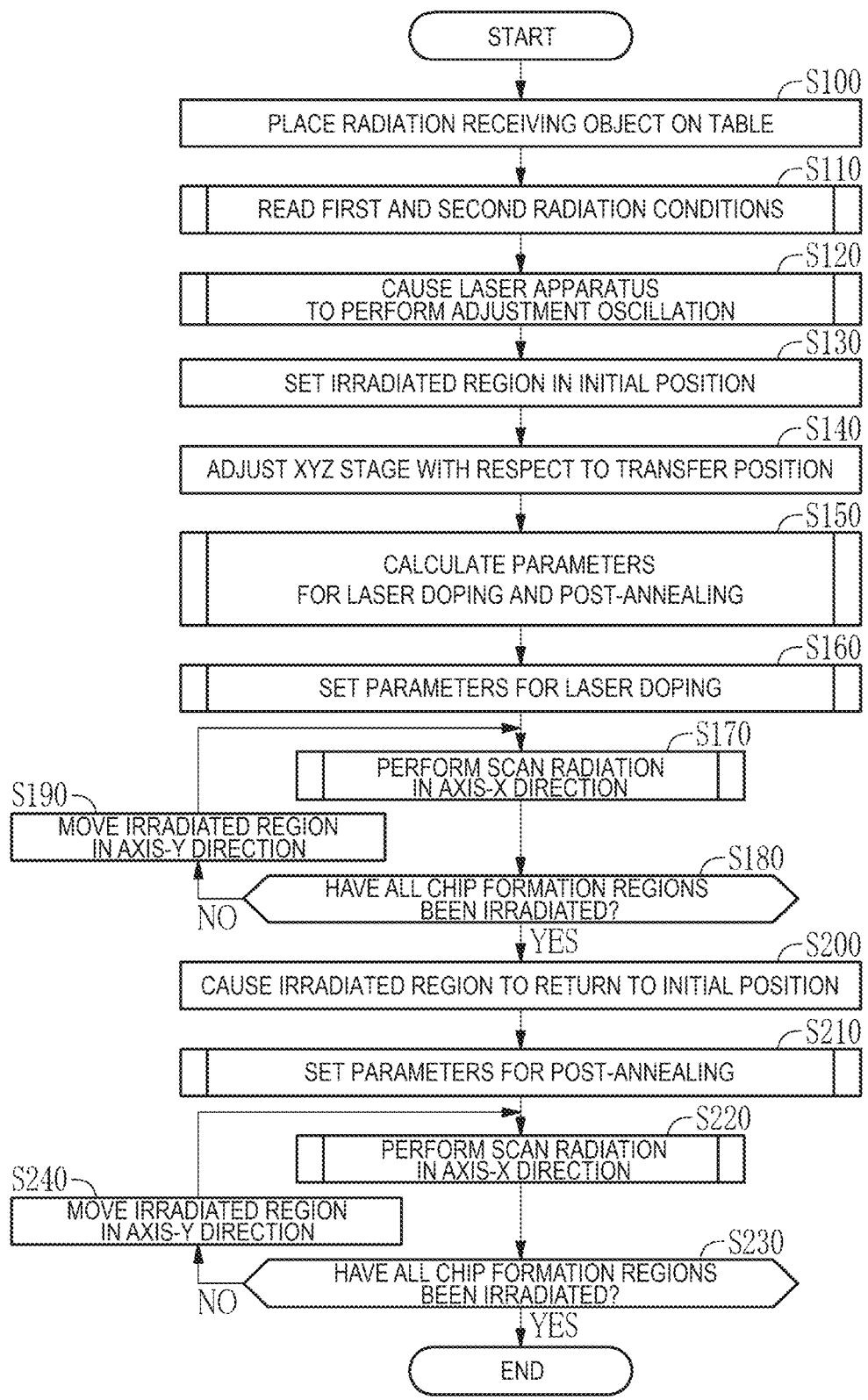
FIG. 5 is a flowchart showing processes in laser doping control and post-annealing control performed by a laser radiation controller.

FIG. 5 is a flowchart showing processes in laser doping control and post-annealing control performed by the laser radiation controller 31. The laser radiation controller 31 is configured to operate the laser radiation system 2 by carrying out the following processes.

When the radiation receiving object 50 is placed on the table 32 (step S100), the laser radiation controller 31 reads the first radiation condition for laser doping and the second radiation condition for post-annealing from the storage (step S110). The first radiation condition contains the first fluence Fd and the first number of radiated pulses Nd. The second radiation condition contains the second fluence Fp and the second number of radiated pulses Np.

The laser radiation controller 31 then causes the laser apparatus 3 to perform adjustment oscillation (step S120). Upon completion of the adjustment oscillation, the laser radiation controller 31 controls the XYZ stage 33 to set the irradiated region A irradiated with the pulsed laser light in the initial position IP shown in FIG. 3A (step S130). The laser radiation controller 31 adjusts the XYZ stage 33 in the axis-Z direction in such a way that the surface of the radiation receiving object 50 is located in the position to which the transfer optical system 44 transfers the rectangularly shaped beam in the focal plane of the condenser lens 46 of the beam homogenizer 43 (step S140).

The laser radiation controller 31 then calculates parameters for laser doping and the post-annealing (step S150). The parameters for laser doping include the first transmittance Td of light passing through the attenuator 42 and the first scan speed Vdx. The parameters for post-annealing include the second transmittance Tp of light passing through the attenuator 42 and the second scan speed Vpx.

The laser radiation controller 31 sets the parameters for laser doping in the laser radiation apparatus 4 (step S160). The laser radiation controller 31 then performs the scan radiation in which the radiation receiving object 50 is irradiated with the pulsed laser light while moving the irradiated region A in the axis-X direction at a fixed speed along the first scan path Sd described before (step S170). The laser radiation controller 31 evaluates whether or not all the chip formation regions 53 have been irradiated with the pulsed laser light whenever the scan radiation corresponding to one row in the axis-X direction is completed (step S180).

In a case where all the chip formation regions 53 have not been irradiated with the pulsed laser light (NO in step S180), the laser radiation controller 31 moves the irradiated region A in the axis-Y direction and places the irradiated region A in the scan radiation start position in the next row (step S190). The laser radiation controller 31 then returns to the process in step S170 and performs the scan radiation in the axis-X direction. The laser radiation controller 31 repeats steps S170 to S190 until all the chip formation regions 53 are irradiated with the pulsed laser light. In a case where all the chip formation regions 53 have been irradiated with the pulsed laser light (YES in step S180), the laser radiation controller 31 terminates the laser doping control and causes the irradiated region A to return to the initial position IP (step S200).

The laser radiation controller 31 then sets the parameters for the post-annealing in the laser radiation apparatus 4 (step S210). The laser radiation controller 31 then performs the scan radiation in which the radiation receiving object 50 is irradiated with the pulsed laser light while moving the irradiated region A in the axis-X direction at a fixed speed along the second scan path Sp described before (step S220). The following steps S230 and S240 are the same as steps S180 and S190 described above. In a case where all the chip formation regions 53 have been irradiated with the pulsed laser light (YES in step S230), the laser radiation controller 31 terminates the post-annealing control.

2.6.2 Details of S110

Figure 6:
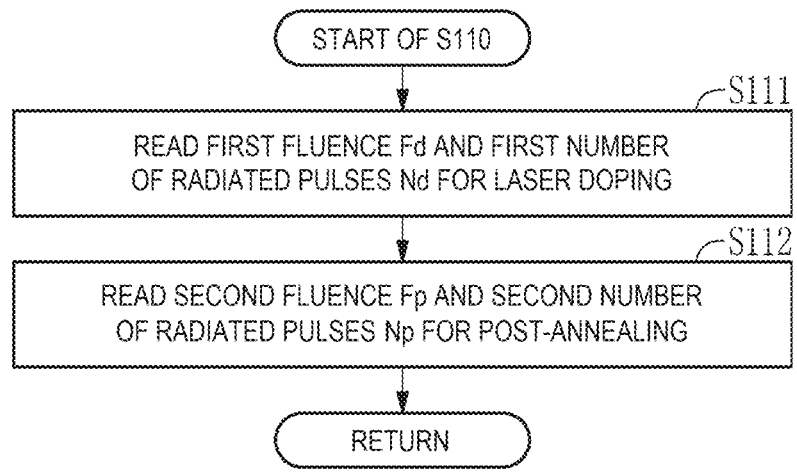
FIG. 6 shows a subroutine illustrating the details of the process of reading first and second radiation conditions.

FIG. 6 shows a subroutine illustrating the details of the process of reading the first and second radiation conditions (step S110) in the main procedure shown in FIG. 5. In step S110, the laser radiation controller 31 first reads the first fluence Fd and the first number of radiated pulses Nd as the first radiation condition from the storage (step S111). The laser radiation controller 31 then reads the second fluence Fp and the second number of radiated pulses Np as the second radiation condition from the storage (step S112). The laser radiation controller 31 then returns to the processes in the main procedure.

2.6.3 Details of S120

Figure 7:
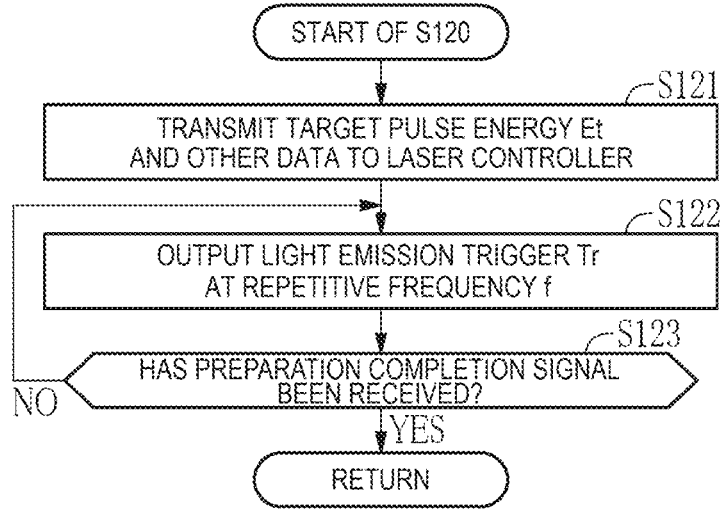
FIG. 7 shows a subroutine illustrating the details of the process of causing a laser apparatus to perform adjustment oscillation.

FIG. 7 shows a subroutine illustrating the details of the process of causing the laser apparatus 3 to perform the adjustment oscillation (step S120) in the main procedure shown in FIG. 5. In step S120, the laser radiation controller 31 first transmits the target pulse energy Et and other data to the laser controller 13 (step S121). For example, the target pulse energy Et is 100 mJ.

The laser radiation controller 31 then outputs the light emission trigger Tr at the repetitive frequency f to the laser controller 13 (step S122). The laser radiation controller 31 then evaluates whether or not the preparation completion signal Rd has been received from the laser controller 13 (step S123). When the laser radiation controller 31 has not received the preparation completion signal Rd (NO in step S123), the laser radiation controller 31 returns to step S122. When the laser radiation controller 31 has received the preparation completion signal Rd (YES in step S123), the laser radiation controller 31 returns to the processes in the main procedure. The repetitive frequency f is substantially equal to the repetitive frequency in the scan exposure and is, for example, 6000 Hz.

2.6.4 Details of S150

FIG. 8 shows a subroutine illustrating the details of the process of calculating the parameters for laser doping and post-annealing (step S150) in the main procedure shown in FIG. 5. In step S150, the laser radiation controller 31 first uses data on the first fluence Fd to calculate the first transmittance Td for laser doping based on Expression (9) described above (step S151). The laser radiation controller 31 then uses the data on the first number of radiated pulses Nd, the repetitive frequency f, and the first beam width Bx to calculate the first scan speed Vdx for laser doping based on Expression (2) described above (step S152).

The laser radiation controller 31 then uses data on the second fluence Fp to calculate the second transmittance Tp for post-annealing based on Expression(9) described above (step S153). The laser radiation controller 31 then uses the data on the second number of radiated pulses Np, the repetitive frequency f, and the first beam width Bx to calculate the second scan speed Vpx for post-annealing based on Expression (3) described above (step S154). The laser radiation controller 31 then returns to the processes in the main procedure.

2.6.5 Details of S160

FIG. 9 shows a subroutine illustrating the details of the process of setting the parameters for the laser doping (step S160) in the main procedure shown in FIG. 5. In step S160, the laser radiation controller 31 first sets the transmittance of light passing through the attenuator 42 at the first transmittance Td calculated in step S151 (step S161). Specifically, the laser radiation controller 31 sets the rotary stages 42c and 42d provided in the attenuator 42 in such a way that the transmittance of light passing through the attenuator 42 is the first transmittance Td.

The laser radiation controller 31 then sets the scan radiation speed at the first scan speed Vdx calculated in step S152 (step S162). Specifically, the laser radiation controller 31 sets the XYZ stage 33 in such a way that the speed at which the irradiated region A is moved relative to the radiation receiving object 50 is the first scan speed Vdx. The laser radiation controller 31 then returns to the processes in the main procedure.

2.6.6 Details of S210

Figure 10:
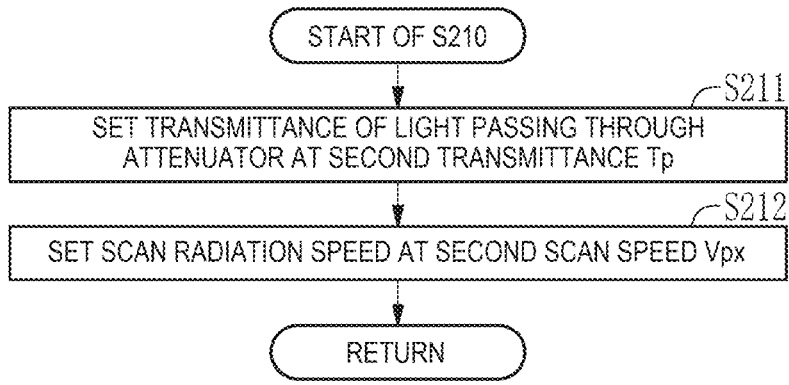
FIG. 10 shows a subroutine illustrating the details of the process of setting the parameters for post-annealing.

FIG. 10 shows a subroutine illustrating the details of the process of setting the parameters for post-annealing (step S210) in the main procedure shown in FIG. 5. In step S210, the laser radiation controller 31 first sets the transmittance of light passing through the attenuator 42 at the second transmittance Tp calculated in step S153 (step S211). Specifically, the laser radiation controller 31 sets the rotary stages 42c and 42d provided in the attenuator 42 in such a way that the transmittance of light passing through the attenuator 42 is the second transmittance Tp.

The laser radiation controller 31 then sets the scan radiation speed at the second scan speed Vpx calculated in step S154 (step S212). Specifically, the laser radiation controller 31 controls the XYZ stage 33 in such a way that the speed at which the irradiated region A is moved relative to the radiation receiving object 50 is the second scan speed Vpx. The laser radiation controller 31 then returns to the processes in the main procedure.

2.6.7 Details of S170

Figure 11:
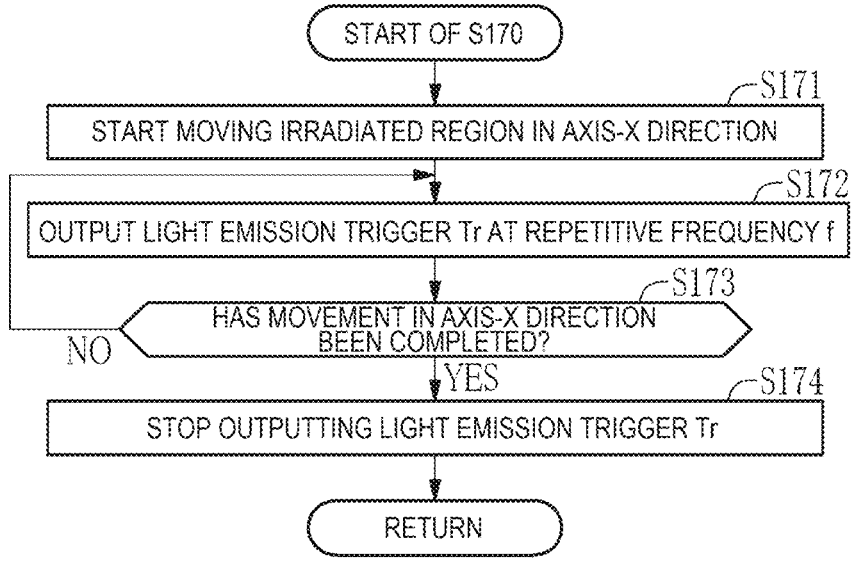
FIG. 11 shows a subroutine illustrating the details of the process of performing the scan radiation in an axis-X direction.

FIG. 11 shows a subroutine illustrating the details of the process of performing the scan radiation in the axis-X direction (step S170) in the main procedure shown in FIG. 5. In step S170, the laser radiation controller 31 first controls the XYZ stage 33 to cause it to start moving the irradiated region A in the axis-X direction (step S171). The movement of the irradiated region A includes accelerated motion, fixed-speed linear motion, and decelerated motion, and the laser radiation controller 31 sets the XYZ stage 33 in such a way that the speed of fixed-speed linear motion is the first scan speed Vdx.

Upon the start of the movement of the irradiated region A, the laser radiation controller 31 outputs the light emission trigger Tr at the repetitive frequency f to the laser controller 13 (step S172). For example, the repetitive frequency f is 6000 Hz. Until the movement of the irradiated region A in the axis-X direction is completed (as long as result of step S173 is No), the laser radiation controller 31 carries out step S172 to output the light emission trigger Tr to the laser controller 13. Upon the completion of the movement of the irradiated region A in the axis-X direction (YES in step S173), the laser radiation controller 31 stops outputting the light emission trigger Tr to the laser controller 13 (step S174). The laser radiation controller 31 then returns to the processes in the main procedure.

The details of step S220 in the main procedure are the same as the details of step S170 described above and will therefore not be described.

2.7 Problems

The first fluence Fd appropriate for the laser doping greatly differs from the second fluence Fp appropriate for the post-annealing. Therefore, in Comparative Example, the transmittance T of light passing through the attenuator 42 is so changed that the fluence in the laser doping differs from the fluence in the post-annealing. Specifically, since the area S of the irradiated region A (=Bx·By) is fixed, the transmittance T of light passing through the attenuator 42 is changed to a value proportional to the fluence F based on Expression (9) or (10) described above.

Since the first fluence Fd and the second fluence Fp satisfy the relationship Fd>Fp, energy corresponding to a ratio (Td−Tp)/Td is undesirably lost in the attenuator 42 in the post-annealing with respect to the laser doping. The post-annealing therefore poses a problem of low use efficiency of the pulse energy of the pulsed laser light. As described above, when the pulse energy use efficiency is low in the post-annealing, the scan radiation requires a long period, resulting in a decrease in throughput of the laser radiation system.

In embodiments described below, to solve the problem described above, a beam homogenizer configured to be capable of changing the beam width in the direction in which a target object is scanned with the pulsed laser light is used to change the fluence of the pulsed laser light.

3. First Embodiment

3.1 Configuration

Figure 12:
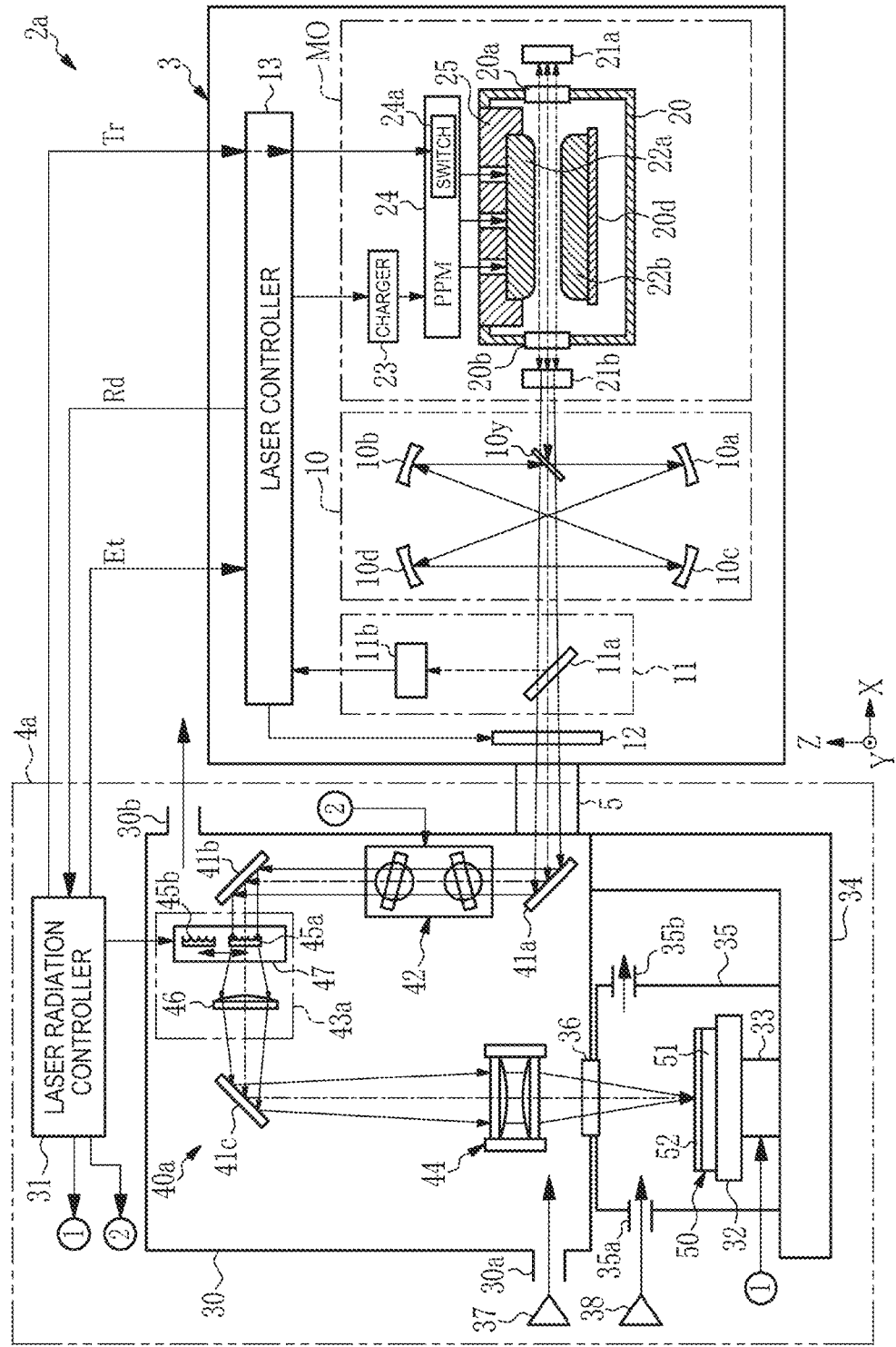
FIG. 12 schematically shows the configuration of a laser radiation system according to a first embodiment.

FIG. 12 schematically shows the configuration of a laser radiation system 2a according to the first embodiment of the present disclosure. The laser radiation system 2a according to the first embodiment includes a laser radiation apparatus 4a in place of the laser radiation apparatus 4 provided in the laser radiation system 2 according to Comparative Example. In the following description, substantially the same portions as the components of the laser radiation system 2 according to Comparative Example have the same reference characters and will not be described as appropriate. The laser radiation system 2a includes the laser apparatus 3 and the laser radiation apparatus 4a. The laser apparatus 3 has the same configuration as that of the laser apparatus 3 in Comparative Example. The laser radiation apparatus 4a includes a beam homogenizer 43a in an optical system 40a in place of the beam homogenizer 43 in Comparative Example.

The beam homogenizer 43a includes a first fly-eye lens 45a for laser doping beam generation, a second fly-eye lens 45b for post-annealing beam generation, a uniaxial movement stage 47 as a first actuator, and the condenser lens 46. The first fly-eye lens 45a and the second fly-eye lens 45b are disposed on the uniaxial movement stage 47. The uniaxial movement stage 47 is configured to be controlled by a control signal inputted from the laser radiation controller 31. The laser radiation controller 31 is configured to control the uniaxial movement stage 47 to selectively place one of the first fly-eye lens 45a and the second fly-eye lens 45b in the optical path of the pulsed laser light. That is, the beam homogenizer 43a is configured to be capable of selectively generating the beam for laser doping or the beam for post-annealing.

Figure 13A:
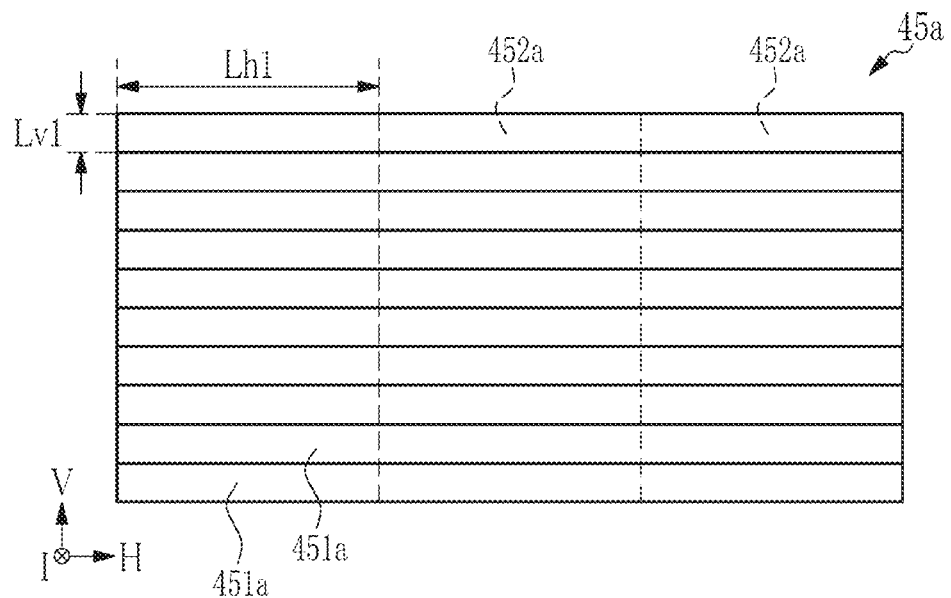
FIG. 13A shows the configuration of a first fly-eye lens.
Figure 13B:
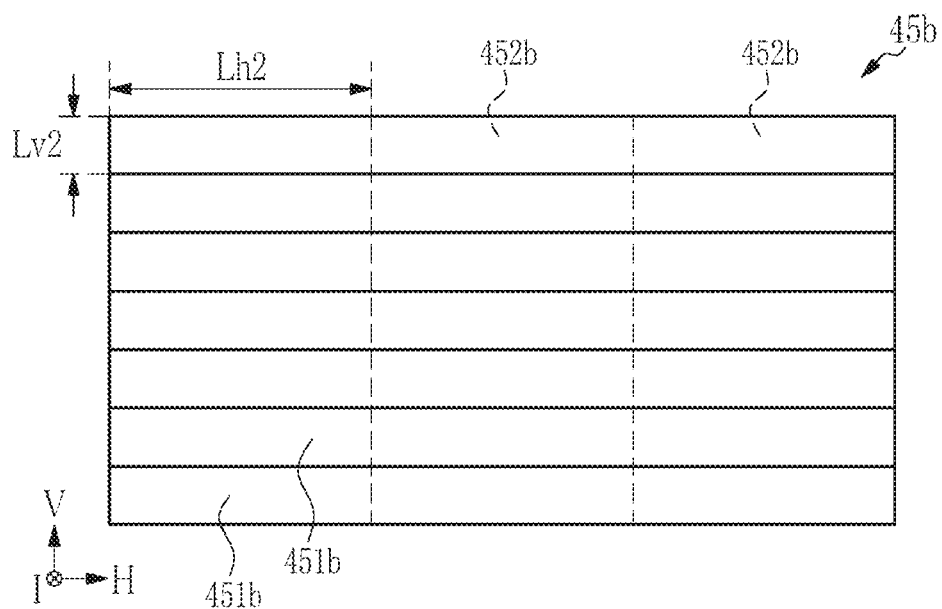
FIG. 13B shows the configuration of a second fly-eye lens.

FIG. 13A shows the configuration of the first fly-eye lens 45a. FIG. 13B shows the configuration of the second fly-eye lens 45b. The first fly-eye lens 45a and the second fly-eye lens 45b each have the same configuration as that of the fly-eye lens 45 in Comparative Example shown in FIG. 2 except that the cylindrical surfaces are arranged at different intervals.

A plurality of first cylindrical surfaces 451a, which each have negative curvature in the axis-V direction and extend in the axis-H direction, are arranged on a first surface of the first fly-eye lens 45a in the axis-V direction at first intervals Lv1. A plurality of second cylindrical surfaces 452a, which each have negative curvature in the axis-H direction and extend in the axis-V direction, are arranged on a second surface of the first fly-eye lens 45a in the axis-H direction at second intervals Lh1. A plurality of first cylindrical surfaces 451b, which each have negative curvature in the axis-V direction and extend in the axis-H direction, are arranged on a first surface of the second fly-eye lens 45b in the axis-V direction at first intervals Lv2. A plurality of second cylindrical surfaces 452b, which each have negative curvature in the axis-H direction and extend in the axis-V direction, are arranged on a second surface of the second fly-eye lens 45b in the axis-H direction at second intervals Lh2.

The intervals Lv1, Lv2, Lh1, and Lh2 satisfy the following relationships: Lv1<Lh1, Lv2<Lh2, Lv1<Lv2, and Lh1=Lh2. The first fly-eye lens 45a is disposed in the optical path of the pulsed laser light in the laser doping. The second fly-eye lens 45b is disposed in the optical path of the pulsed laser light in the post-annealing.

Figure 14A:
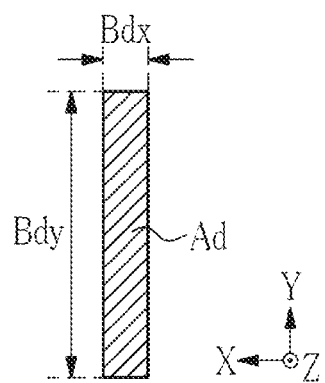
FIG. 14A shows an irradiated region of the radiation receiving object irradiated with pulsed laser light in the laser doping.
Figure 14B:
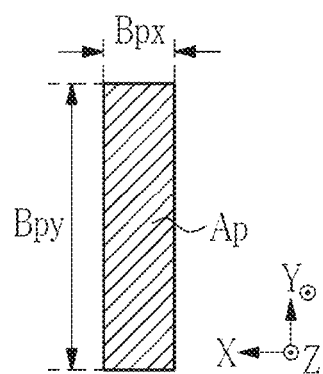
FIG. 14B shows the irradiated region of the radiation receiving object irradiated with the pulsed laser light in the post-annealing.

FIG. 14A shows an irradiated region Ad of the radiation receiving object 50 irradiated with the laser doping beam generated by the first fly-eye lens 45a. FIG. 14B shows an irradiated region Ap of the radiation receiving object 50 irradiated with the post-annealing beam generated by the second fly-eye lens 45b. The irradiated region Ad has a rectangular shape and has a first beam width Bdx in the axis-X direction and a second beam width Bdy in the axis-Y direction. The irradiated region Ap has a rectangular shape and has a first beam width Bpx in the axis-X direction and a second beam width Bpy in the axis-Y direction.

The beam widths Bdx, Bdy, Bpx, and Bpy satisfy the following relationships: Bdx<Bdy, Bpx<Bpy, Bdx<Bpx, and Bdy=Bpy. The second beam widths Bdy and Bpy are equal to the first beam width By in Comparative Example and satisfy Expression (1) described above.

3.2 Operation of laser radiation system

3.2.1 Main procedure

Figure 15:
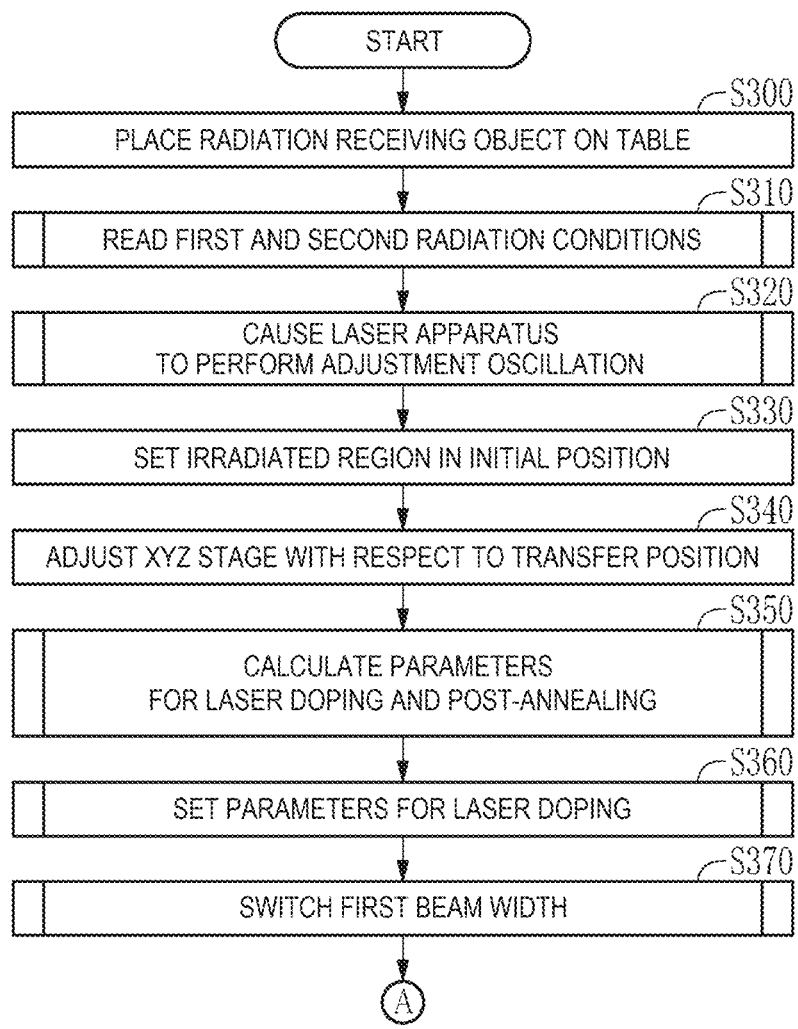
FIG. 15 is a first half of a flowchart showing processes in the laser doping control and the post-annealing control performed by laser radiation controller.
Figure 16:
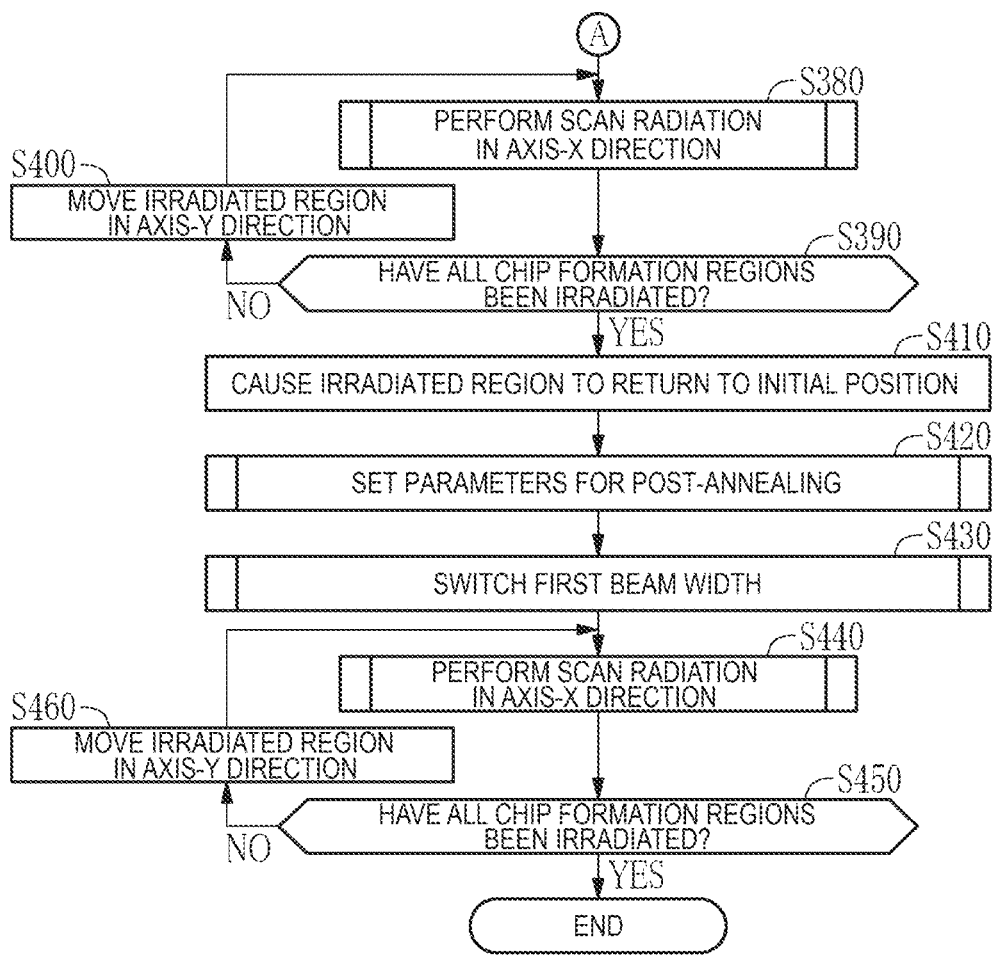
FIG. 16 is a second half of the flowchart showing the processes in the laser doping control and the post-annealing control performed by laser radiation controller.

FIGS. 15 and 16 are flowchart showing processes in the laser doping control and the post-annealing control performed by the laser radiation controller 31. The laser radiation controller 31 is configured to operate the laser radiation system 2a by carrying out the following processes.

Steps S300 to S350 in the present embodiment are the same as steps S100 to S150 in Comparative Example. In the present embodiment, the laser radiation controller 31 sets the parameters for laser doping in the laser radiation apparatus 4a (step S360) after step S350. The laser radiation controller 31 then switches the first beam width of the pulsed laser light in the axis-X direction with which the radiation receiving object 50 is irradiated to the first beam width Bdx (step S370). The first beam width is thus set at the first beam width Bdx for laser doping. The following steps S380 to S410 are the same as steps S170 to S200 in Comparative Example.

In the present embodiment, the laser radiation controller 31 sets the parameters for post-annealing in the laser radiation apparatus 4a (step S420) after step S410. The laser radiation controller 31 then switches the first beam width of the pulsed laser light in the axis-X direction with which the radiation receiving object 50 is irradiated to the first beam width Bpx (step S430). The first beam width is thus set at the first beam width Bpx for post-annealing. The following steps S440 to S460 are the same as steps S220 to S240 in Comparative Example.

3.2.2 Details of S350

Figure 17:
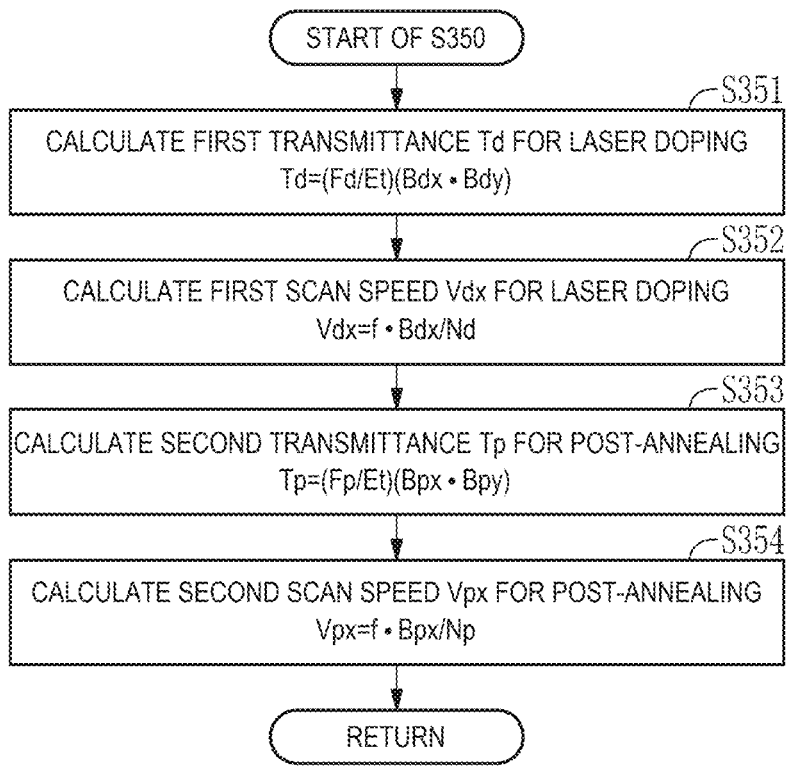
FIG. 17 shows a subroutine illustrating the details of the process of calculating the parameters for laser doping and post-annealing.

FIG. 17 shows a subroutine illustrating the details of the process of calculating the parameters for laser doping and post-annealing (step S350) in the main procedure shown in FIG. 15. In step S350, the laser radiation controller 31 first uses the data on the first fluence Fd to calculate the first transmittance Td of light passing through the attenuator 42 for laser doping based on Expression (11) below (step S351).

$$Td=(Fd/Et)(Bdx \cdot Bdy) \quad (11)$$

The laser radiation controller 31 then uses the data on the first number of radiated pulses Nd, the repetitive frequency f, and the first beam width Bdx to calculate the first scan speed Vdx for laser doping based on Expression (12) below (step S352).

$$Vdx=f \cdot Bdx/Nd \quad (12)$$

The laser radiation controller 31 then uses the data on the second fluence Fp to calculate the second transmittance Tp of light passing through the attenuator 42 for post-annealing based on Expression (13) below (step S353). It is noted that Bdy=Bpy.

$$Tp=(Fp/Et)(Bpx\cdot Bpy) \quad (13)$$

The laser radiation controller 31 then uses the data on the second number of radiated pulses Np, the repetitive frequency f, and the first beam width Bpx to calculate the second scan speed Vpx for post-annealing based on Expression (14) below (step S354).

$$Vpx=f\cdot Bpx/Np \quad (14)$$

The laser radiation controller 31 then returns to the processes in the main procedure.

3.2.3 Details of S360

Figure 18:
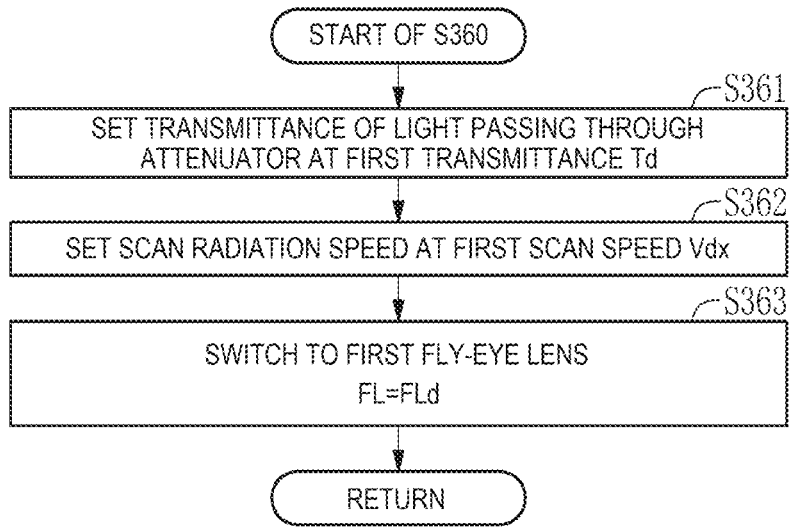
FIG. 18 shows a subroutine illustrating the details of the process of setting the parameters for laser doping.

FIG. 18 shows a subroutine illustrating the details of the process of setting the parameters for the laser doping (step S360) in the main procedure shown in FIG. 15. Steps S361 and S362 are the same as steps S161 and S162 in Comparative Example. After step S362, the laser radiation controller 31 sets a flag FL in such a way that FL=FLd is satisfied (step S363). The laser radiation controller 31 then returns to the processes in the main procedure.

3.2.4 Details of S420

Figure 19:
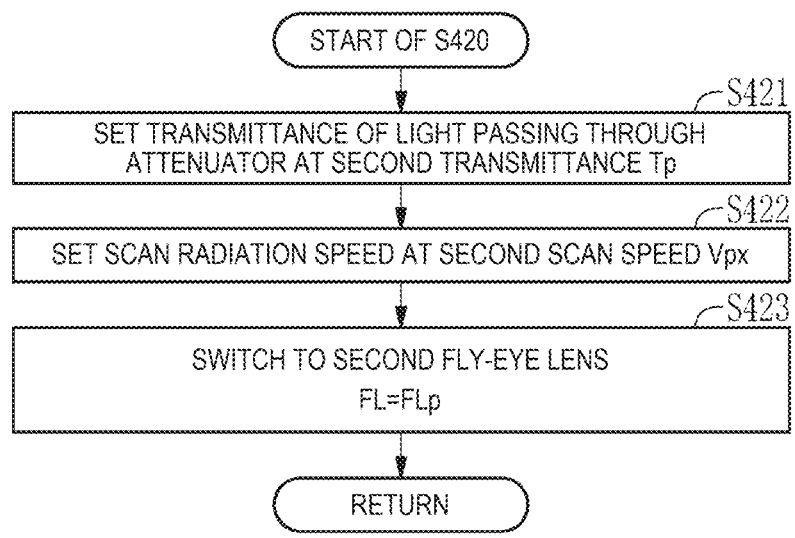
FIG. 19 shows a subroutine illustrating the details of the process of setting the parameters for post-annealing.

FIG. 19 shows a subroutine illustrating the details of the process of setting the parameters for post-annealing (step S420) in the main procedure shown in FIG. 16. Steps S421 and S422 are the same as steps S211 and S212 in Comparative Example. After step S422, the laser radiation controller 31 sets the flag FL in such a way that FL=FLp is satisfied (step S423). The laser radiation controller 31 then returns to the processes in the main procedure.

3.2.5 Details of S370

Figure 20:
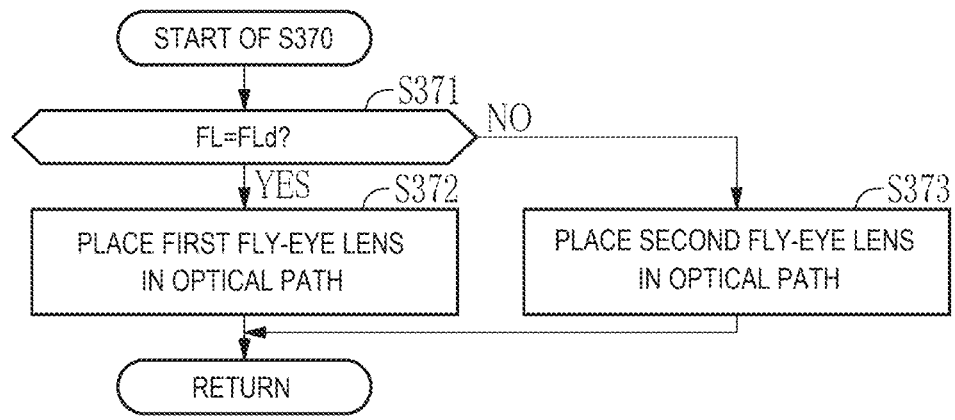
FIG. 20 shows a subroutine illustrating the details of the process of switching a first beam width to another.

FIG. 20 shows a subroutine illustrating the details of the process of switching the first beam width to the other (step S370) in the main procedure shown in FIG. 16. In step S370, the laser radiation controller 31 first evaluates whether or not the flag FL is FLd (step S371). When FL=FLd is satisfied (YES in step S371), the laser radiation controller 31 controls the uniaxial movement stage 47 to place the first fly-eye lens 45a in the optical path of the pulsed laser light (step S372). The irradiated region Ad shown in FIG. 14A is thus the irradiated region irradiated with the pulsed laser light.

On the other hand, when FL=FLd is not satisfied (NO in step S371), the laser radiation controller 31 controls the uniaxial movement stage 47 to place the second fly-eye lens 45b in the optical path of the pulsed laser light (step S373). The irradiated region Ap shown in FIG. 14B is thus the irradiated region irradiated with the pulsed laser light. The laser radiation controller 31 then returns to the processes in the main procedure.

The details of step S430 in the main procedure are the same as the details of step S370 described above and will therefore not be described.

3.3 Effects

In the present embodiment, the first fly-eye lens 45a and the second fly-eye lens 45b are preferably so configured that the first intervals Lv1 and Lv2 satisfy Expression (15) below.

$$Lv1/Lv2=Fp/Fd \quad (15)$$

In this case, the first beam width Bdx for laser doping and a first beam width Bpx for post-annealing satisfy Expression (16) below.

$$Bdx\cdot Fd=Bpx\cdot Fp \quad (16)$$

As a result, when Expression (15) described above is substantially satisfied, the second transmittance Tp for post-annealing calculated in step S353 is substantially equal to the first transmittance Td for laser doping calculated in step S351.

As described above, in the present embodiment, the transmittance of light passing through the attenuator 42 in the laser doping is substantially equal to that in the post-annealing, whereby energy loss in the post-annealing with respect to the laser doping is suppressed. Therefore, in the present embodiment, the use efficiency of the pulse energy of the pulsed laser light is improved and the period required for the scan radiation is shortened, whereby the throughput of the laser radiation system is improved, as compared with those in Comparative Example.

In the first embodiment, the first fly-eye lens 45a and the second fly-eye lens 45b each have concave cylindrical surfaces, but not necessarily, and may each instead have convex cylindrical surfaces. The fly-eye lenses may still instead be each formed of a Fresnel lens having the same optical characteristics of cylindrical lenses and formed on a substrate.

In the first embodiment, the first fly-eye lens 45a and the second fly-eye lens 45b are each an integrated optical element, and the fly-eye lenses may instead each be formed of two cylindrical arrays. In this case, the two cylindrical arrays may be so disposed that the directions in which the cylindrical surfaces are arranged are perpendicular to each other.

4. Second Embodiment 4.1 Configuration

Figure 21:
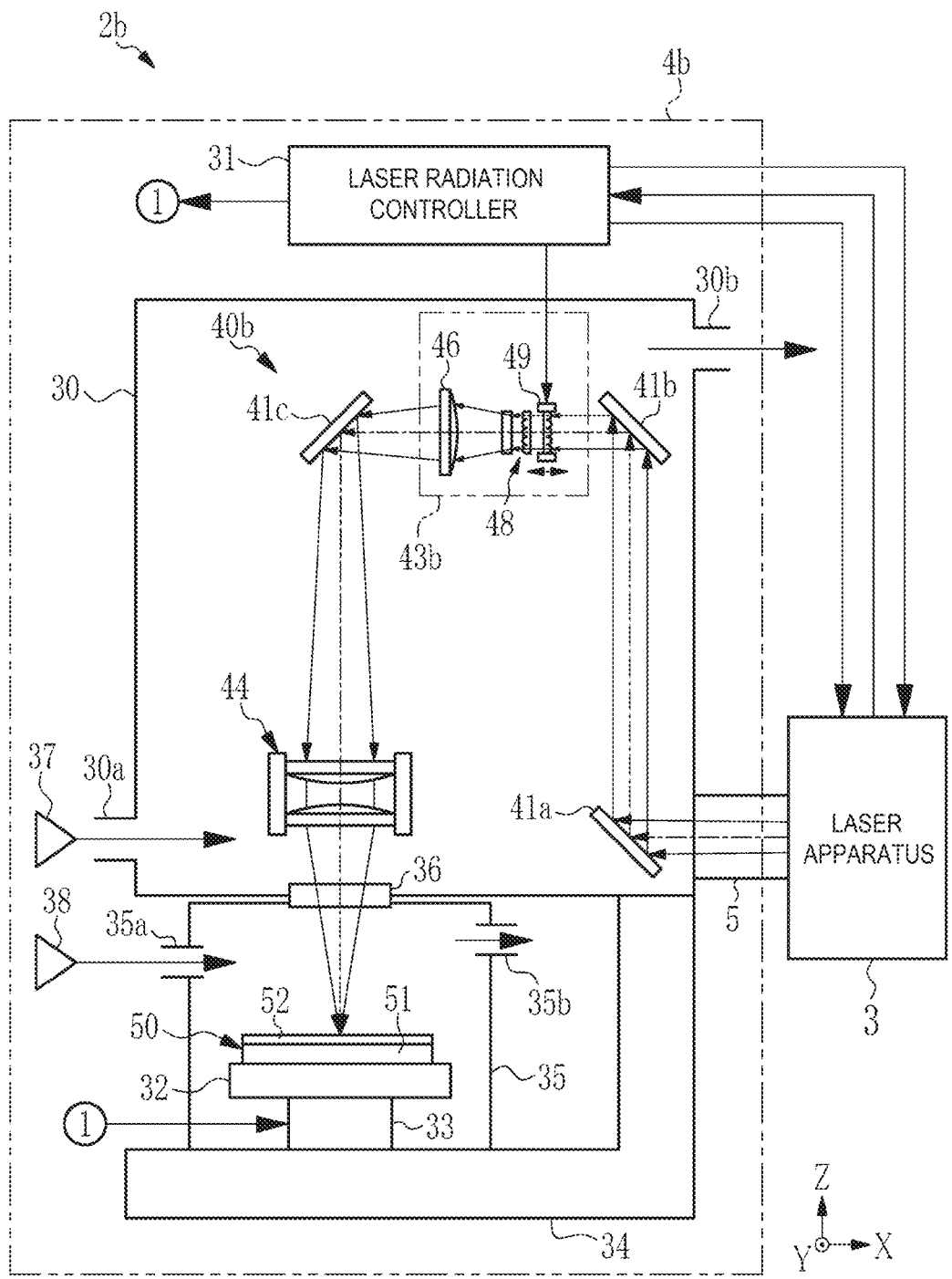
FIG. 21 schematically shows the configuration of a laser radiation system according to a second embodiment.

FIG. 21 schematically shows the configuration of a laser radiation system 2b according to a second embodiment of the present disclosure. The laser radiation system 2b according to the second embodiment includes a laser radiation apparatus 4b in place of the laser radiation apparatus 4a provided in the laser radiation system 2a according to the first embodiment. In the following description, substantially the same portions as the components of the laser radiation system 2a according to the first embodiment have the same reference characters and will not be described as appropriate.

The laser radiation system 2b includes the laser apparatus 3 and the laser radiation apparatus 4b. The laser apparatus 3 has the same configuration as that of the laser apparatus 3 in the first embodiment. In FIG. 21, the laser apparatus 3 is omitted. The laser radiation apparatus 4b includes a beam homogenizer 43b in an optical system 40b in place of the beam homogenizer 43 in Comparative Example. In the present embodiment, the optical system 40b does not include the attenuator 42.

The beam homogenizer 43b includes a cylindrical lens group 48 and a uniaxial movement stage 49 as a second actuator in place of the first fly-eye lens 45a, the second fly-eye lens 45b, and the uniaxial movement stage 47 in the first embodiment. The cylindrical lens group 48 forms a fly-eye lens.

Figure 22A:
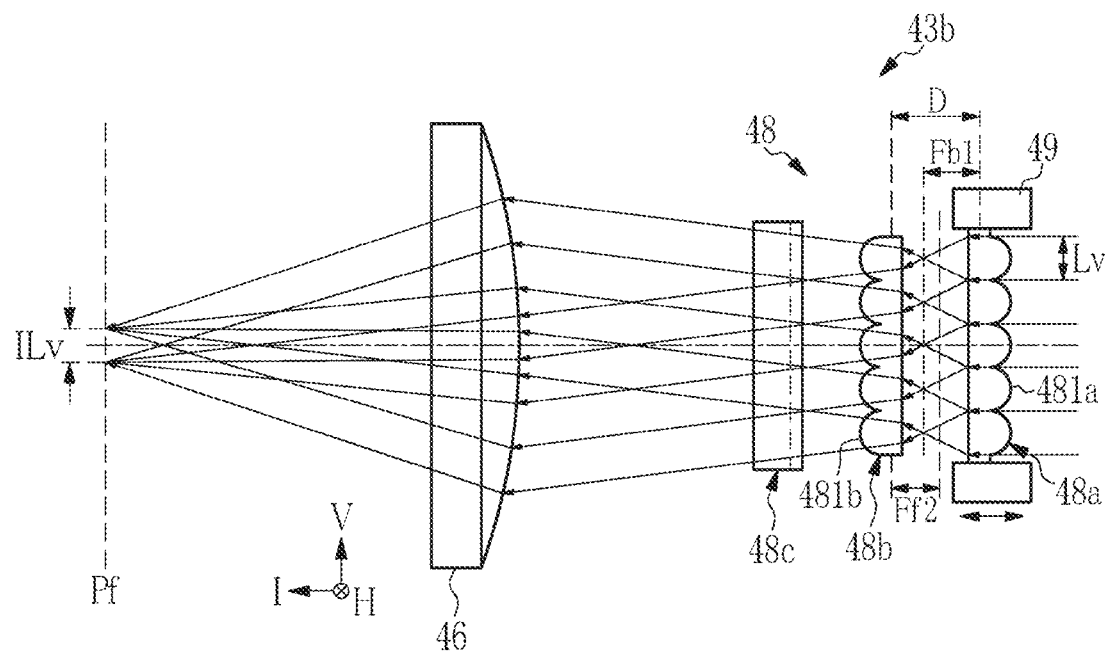
FIG. 22A shows a beam homogenizer viewed along the axis-H direction.
Figure 22B:
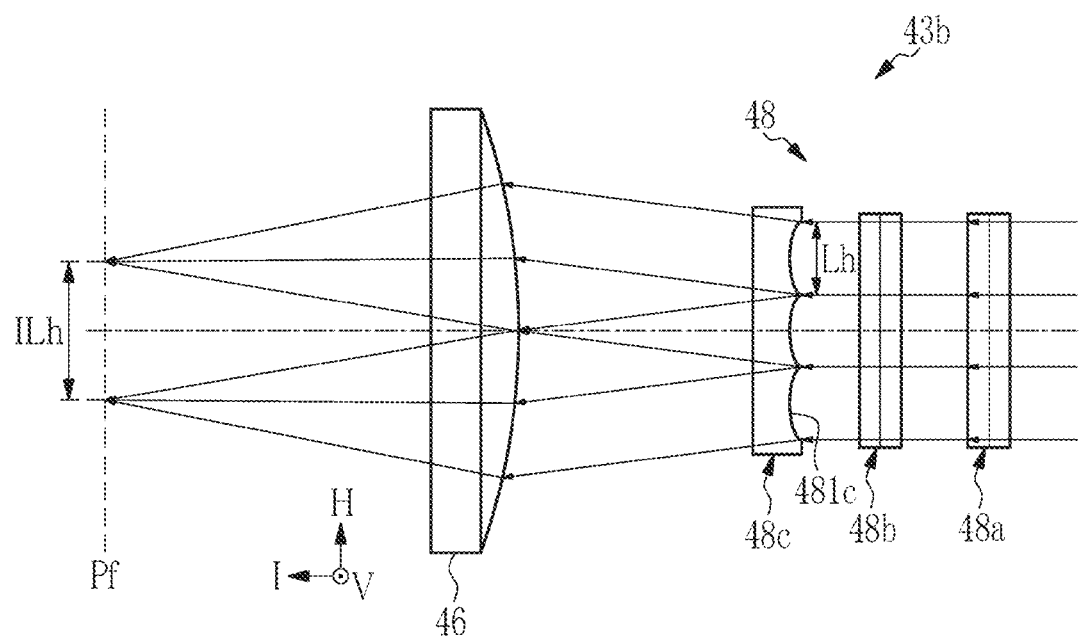
FIG. 22B shows the beam homogenizer viewed along the axis-V direction.

FIGS. 22A and 22B show the configuration of the beam homogenizer 43b in detail. FIG. 22A shows the beam homogenizer 43b viewed along the axis-H direction. FIG. 22B shows the beam homogenizer 43b viewed along the axis-V direction. The cylindrical lens group 48 includes a first cylindrical lens array 48a, a second cylindrical lens array 48b, and a third cylindrical lens array 48c. The first cylindrical lens array 48a, the second cylindrical lens array 48b, and the third cylindrical lens array 48c, and the condenser lens 46 are disposed in the optical path of the pulsed laser light in the presented order from the side on the upstream of the optical path.

The first cylindrical lens array 48a has a plurality of convex cylindrical surfaces 481a, which each have predetermined radius of curvature in the axis-V direction and extend in the axis-H direction, arranged at the first intervals Lv in the axis-V direction. The second cylindrical lens array 48b has a plurality of convex cylindrical surfaces 482a, which each have predetermined radius of curvature in the axis-V direction and extend in the axis-H direction, arranged at the first intervals Lv in the axis-V direction. The first cylindrical lens array 48a and the second cylindrical lens array 48b have the same configuration and are so disposed that the flat surfaces of the two lens arrays face each other.

The uniaxial movement stage 49 is configured to move the first cylindrical lens array 48a in the axis-I direction based on a control signal inputted from the laser radiation controller 31. Moving the first cylindrical lens array 48a in the axis-I direction changes the gap D between the first cylindrical lens array 48a and the second cylindrical lens array 48b.

The third cylindrical lens array 48c has a plurality of concave cylindrical surfaces 481c, which each have predetermined radius of curvature in the axis-H direction and extend in the axis-V direction, arranged at the second intervals Lh in the axis-H direction. The third cylindrical lens array 48c is so disposed that the cylindrical surfaces 481c face the second cylindrical lens array 48b.

The second interval Lh is so set that a beam width ILh of the pulsed laser light in the axis-H direction in a focal plane Pf of the condenser lens 46 satisfies Expression (17) below.

$$By = M \cdot ILh \quad (17)$$

In Expression (17), M represents the transfer magnification provided by the transfer optical system 44. Reference character By represents the width of the irradiated region A shown in FIG. 3 in the axis-X direction, that is, the second beam width and satisfies Expression (1) described above.

4.2 Method for setting second beam width

A method for setting the width of the irradiated region A shown in FIG. 3 in the axis-X direction, that is, the first beam width Bx will next be described. In the present embodiment, a beam width ILv of the pulsed laser light in the axis-V direction in the focal plane Pf of the condenser lens 46 changes in accordance with the value of the gap D. A gap Dw, which minimizes the beam width ILv, is expressed by Expression (18) below.

$$Dw \approx Fb1 + Ff2 \quad (18)$$

In Expression (18), Fb1 represents the back focal length of the first cylindrical lens array 48a, and Ff2 represents the front focal length of the second cylindrical lens array 48b.

The laser radiation controller 31 is configured to control the uniaxial movement stage 49 to change the gap D over the range expressed by Expression (19) below, whereby the beam width ILv can be continuously changed.

$$Ff2 < D < Fb1 + Ff2 \quad (19)$$

The first beam width Bx and the beam width ILv relate to each other in the relationship expressed by Expression (20) below, whereby changing the gap D allows control of the first beam width Bx.

$$Bx = M \cdot ILv \quad (20)$$

In Expression (20), the first beam width Bx is the width of the irradiated region A shown in FIG. 3 in the axis-X direction.

The laser radiation controller 31 is configured to store in advance a function D=f(Bx) or data representing the correspondence between the gap D and the first beam width Bx. The laser radiation controller 31 is configured to control the uniaxial movement stage 49 based on the correspondence to adjust the gap D to set the first beam width Bx at a desired value.

4.3 Operation of Laser Radiation System 4.3.1 Main Procedure

The main procedure according to the present embodiment is the same as that in FIGS. 15 and 16 shown in the first embodiment. Only steps different from those in the first embodiment will be described in detail. In the present embodiment, the details of steps S350, S360, S370, S420, and S430 in the main procedure shown in FIGS. 15 and 16 differ from those in the first embodiment. Steps S350', S360', S370', S420', and S430' different from steps S350, S360, S370, S420, and S430 in the first embodiment will be described below in detail.

4.3.2 Details of S350'

Figure 23:
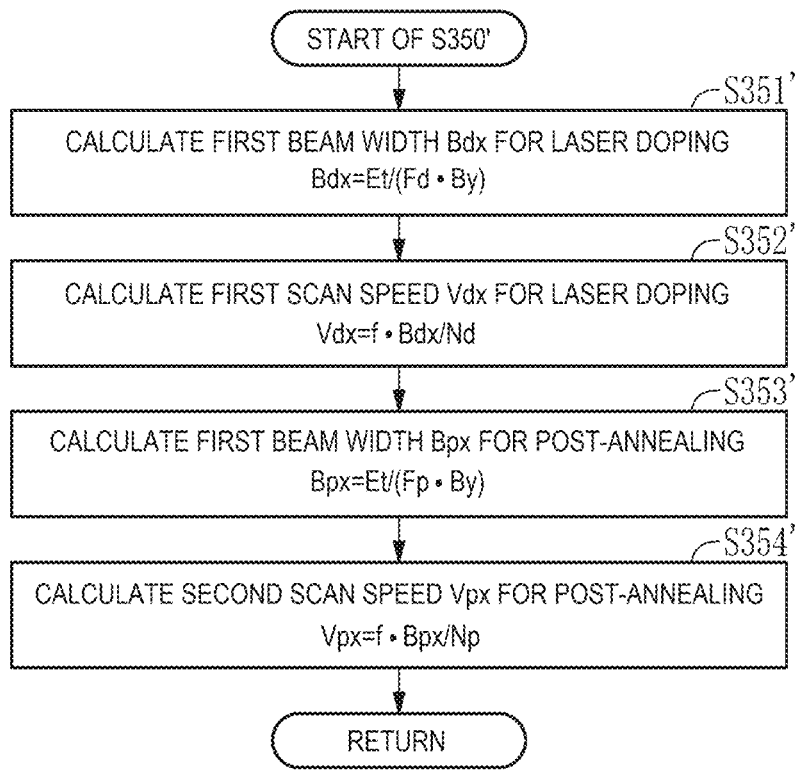
FIG. 23 shows a subroutine illustrating the details of the process of calculating the parameters for laser doping and post-annealing.

FIG. 23 shows a subroutine illustrating the details of the process of calculating the parameters for laser doping and post-annealing (step S350') in the present embodiment. In step S350', the laser radiation controller 31 first uses the data on the first fluence Fd to calculate the first beam width Bdx for laser doping based on Expression (21) below (step S351').

$$Bdx = Et/(Fd \cdot By) \quad (21)$$

Expression (21) described above is based on Expression (11) described before. In the present embodiment, since the attenuator 42 is not provided, it is assumed that Td=1 and Bdy=By.

The laser radiation controller 31 then uses the data on the first number of radiated pulses Nd, the repetitive frequency f, and the first beam width Bdx to calculate the first scan speed Vdx for laser doping based on Expression (12) described before (step S352').

The laser radiation controller 31 then uses the data on the second fluence Fp to calculate the first beam width Bpx for post-annealing based on Expression (22) below (step S353').

$$Bpx = Et/(Fp \cdot By) \quad (22)$$

Expression (22) described above is based on Expression (13) described before. In the present embodiment, since the attenuator 42 is not provided, it is assumed that Tp=1 and Bpy=By.

The laser radiation controller 31 then uses the data on the second number of radiated pulses Np, the repetitive frequency f, and the first beam width Bpx to calculate the second scan speed Vpx for post-annealing based on Expression (14) described before (step S354'). The laser radiation controller 31 then returns to the processes in the main procedure.

4.3.3 Details of S360'

Figure 24:
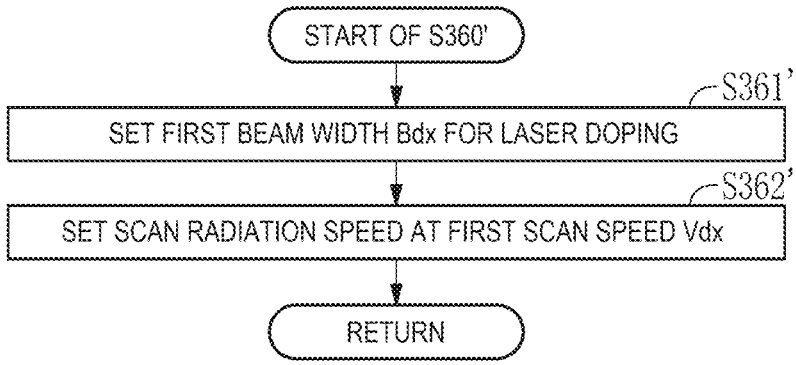
FIG. 24 shows a subroutine illustrating the details of the process of setting the parameters for laser doping.

FIG. 24 shows a subroutine illustrating the details of the process of setting the parameters for the laser doping (step S360') in the present embodiment. In step S360', the laser radiation controller 31 first sets the first beam width Bx at the irradiated region A at the first beam width Bdx for laser doping (step S361'). The laser radiation controller 31 then sets the scan radiation speed at the first scan speed Vdx calculated in step S352' (step S362'). The laser radiation controller 31 then returns to the processes in the main procedure.

4.3.4 Details of S420'

Figure 25:
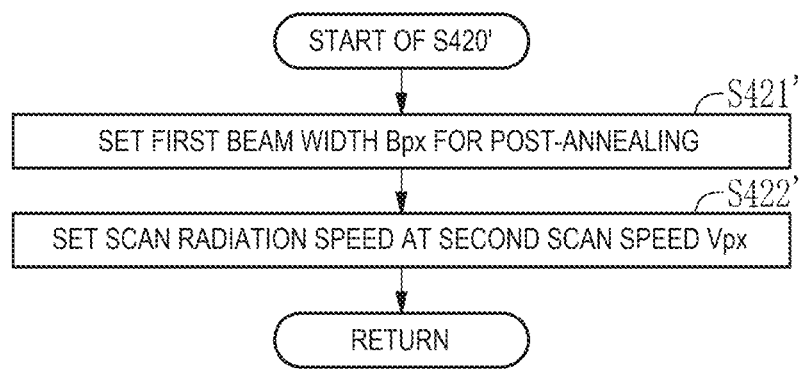
FIG. 25 shows a subroutine illustrating the details of the process of setting the parameters for post-annealing.

FIG. 25 shows a subroutine illustrating the details of the process of setting the parameters for post-annealing (step S420') in the present embodiment. In step S420', the laser radiation controller 31 first sets the first beam width Bx at the irradiated region A at the first beam width Bpx for post-annealing (step S421'). The laser radiation controller 31 then sets the scan radiation speed at the second scan speed Vpx calculated in step S354' (step S422'). The laser radiation controller 31 then returns to the processes in the main procedure.

4.3.5 Details of S370'

Figure 26:
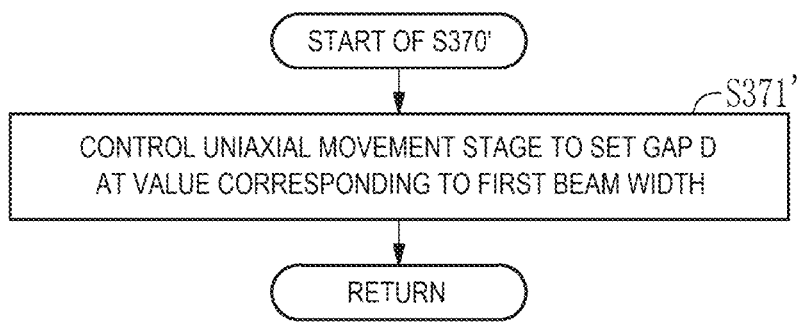
FIG. 26 shows a subroutine illustrating the details of the process of switching the first beam width to another.

FIG. 26 shows a subroutine illustrating the details of the process of switching the first beam width to the other (step S370') in the present embodiment. The laser radiation controller 31 controls the uniaxial movement stage 49 to set the gap D at a value corresponding to the first beam width Bdx for laser doping set in step S361' (step S371'). The laser radiation controller 31 then returns to the processes in the main procedure. The details of step S430' in the main procedure are the same as the details of step S430 described above and will therefore not be described.

4.4 Effects

In the present embodiment, since the first beam width in the scan radiation direction is continuously changeable, the fluence of the pulsed laser light can be precisely controlled. The first fluence Fd for laser doping and the second fluence Fp for post-annealing that satisfy Expression (16) described before can be precisely set without use of any attenuator. Therefore, in the present embodiment, the use efficiency of the pulse energy of the pulsed laser light is further improved and the period required for the scan radiation is shortened, whereby the throughput of the laser radiation system is further improved.

In the present embodiment, the cylindrical surfaces 481c of the third cylindrical array 48c each have a concave shape, but not necessarily, and can have a convex shape.

The first cylindrical lens array 48a and the second cylindrical lens array 48b may each be a single cylindrical lens. Also in this case, controlling the gap between the pair of cylindrical lenses allows adjustment of the beam width ILv.

Table 1 below shows a specific example of the parameters in the laser doping and the post-annealing in the second embodiment in the case where Et=100 mJ. Table 2 below shows a specific example of the parameters in the laser doping and the post-annealing in the second embodiment in the case where Et=40 mJ.

TABLE 1

| | Laser doping | | Post-Annealing | |
|---|---|---|---|---|
| Et | 100 | mJ | Et | 100 mJ |
| f | 6000 | Hz | f | 6000 Hz |
| Bdy | 10 | mm | Bpy | 10 mm |
| Nd | 10 | pulses | Np | 100 pulses |
| Fd | 6 | J/cm² | Fp | 4 J/cm² |
| Bdx | 0.17 | mm | Bpx | 0.25 mm |
| Vdx | 100 | mm/s | Vpx | 15 mm/s |

TABLE 2

| | Laser doping | | Post-Annealing | |
|---|---|---|---|---|
| Et | 40 | mJ | Et | 40 mJ |
| f | 4000 | Hz | f | 4000 Hz |
| Bdy | 10 | mm | Bpy | 10 mm |
| Nd | 10 | pulses | Np | 100 pulses |
| Fd | 6 | J/cm² | Fp | 4 J/cm² |
| Bdx | 0.07 | mm | Bpx | 0.1 mm |
| Vdx | 26.7 | mm/s | Vpx | 4 mm/s |

Tables 1 and 2 show that the laser doping and the post-annealing can be performed in the present embodiment even when the pulsed laser light has low pulse energy, such as 100 mJ or 40 mJ. The fluence Fd in the laser doping and the fluence Fp in the post-annealing are settable by adjustment of the beam width Bdx in the scan radiation direction, as described above. The values of the beam width Bdx in Tables 1 and 2 are adequately adjustable values. Further, the number of radiated pulses Nd in the laser doping and the number of radiated pulses Nd in the post-annealing can be settable by adjustment of the scan speeds Vdx and Vpx, respectively. The scan speeds Vdx and Vpx in Tables 1 and 2 are adequately adjustable values.

5. First Variation

A first variation will next be described. In the first and second embodiments, the scan radiation for laser doping is performed on all the irradiated regions A of the radiation receiving object 50, and then the scan radiation for post-annealing is performed on the irradiated regions A. Instead, the scan radiation for laser doping and the scan radiation for post-annealing can be alternately performed. Variations of the scan radiation control in the first and second embodiments will be described below.

5.1 Scan Radiation Control

Figure 27:
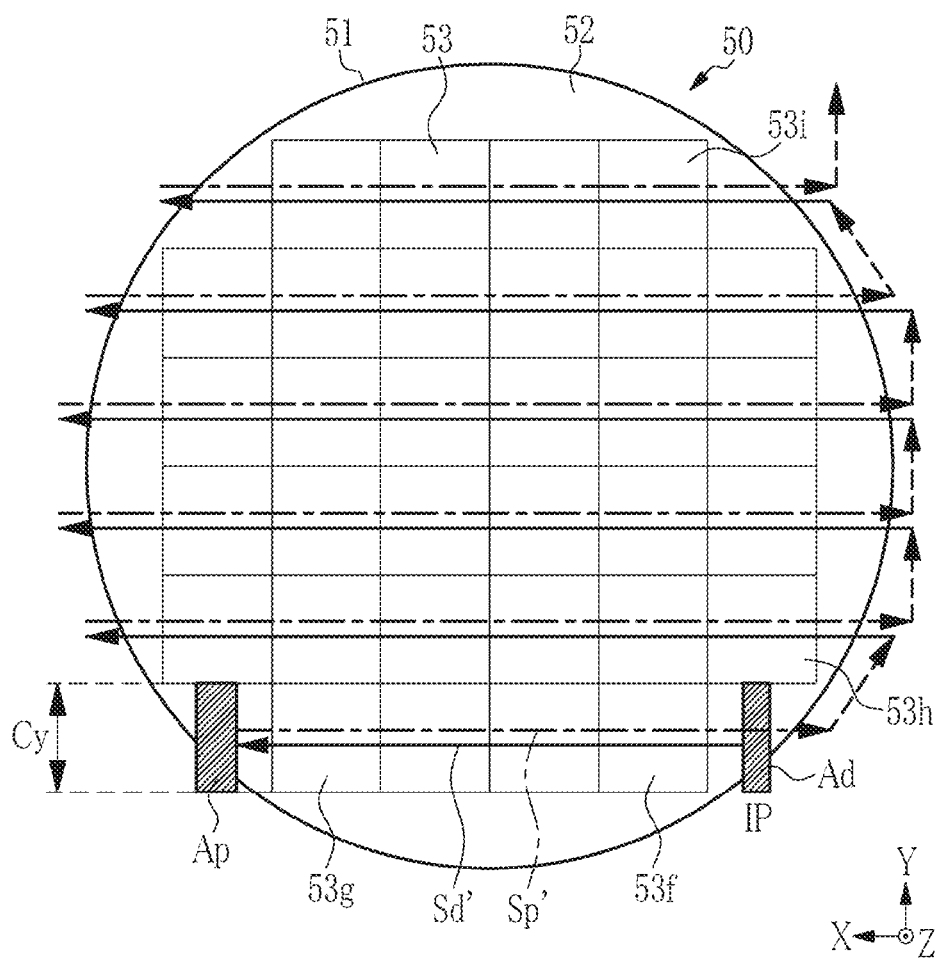
FIG. 27 shows a scan path in a first variation.

FIG. 27 shows a first scan path Sd' in the laser doping and a second scan path Sp' in the post-scanning in the present variation. The first scan path Sd' extends toward the positive side of the axis-X direction. The second scan path Sp' extends toward the negative side of the axis-X direction. That is, in the laser doping, the irradiated region Ad moves toward the positive side of the axis X direction relative to the radiation receiving object 50. On the other hand, in the post-annealing, the irradiated region Ap moves toward the negative side of the axis-X direction relative to the radiation receiving object 50. The irradiated region Ad and the irradiated region Ap have the shapes shown in FIG. 14B.

Before starting the laser doping, the laser radiation controller 31 is configured to set the irradiated region Ad in the initial position IP in the vicinity of a first chip formation region 53f, which is located in an end portion of the first row and starts the scan radiation toward the positive side of the axis-X direction at the first scan speed Vdx along the first scan path Sd'. When the irradiated region Ad passes through a second chip formation region 53g located at the last end of the first row, the laser radiation controller 31 switches the first beam width to the other width and sets the irradiated region Ap in the vicinity of the second chip formation region 53g. The laser radiation controller 31 is thereafter configured to perform the scan radiation from the second chip formation region 53g toward the negative side of the axis-X direction at the second scan speed Vpx.

When the irradiated region Ap passes through the first chip formation region 53f, the laser radiation controller 31 moves the irradiated region Ap toward the positive side of the axis-Y direction by one row. The laser radiation controller 31 is thereafter configured to switch the first beam width to the other and sets the irradiated region Ad in the vicinity of a third chip formation region 53h. The laser radiation controller 31 is configured to repeatedly perform the scan radiation described above, and when the irradiated region Ap passes through a fourth chip formation region 53i located in an end portion of the last row, the laser radiation controller 31 causes the irradiated region Ap to return to the initial position IP. The laser radiation controller 31 is thereafter configured to terminate the scan radiation control. The radiation receiving object 50 may then be replaced with a new radiation receiving object 50.

5.2 Operation of Laser Radiation System

Figure 28:
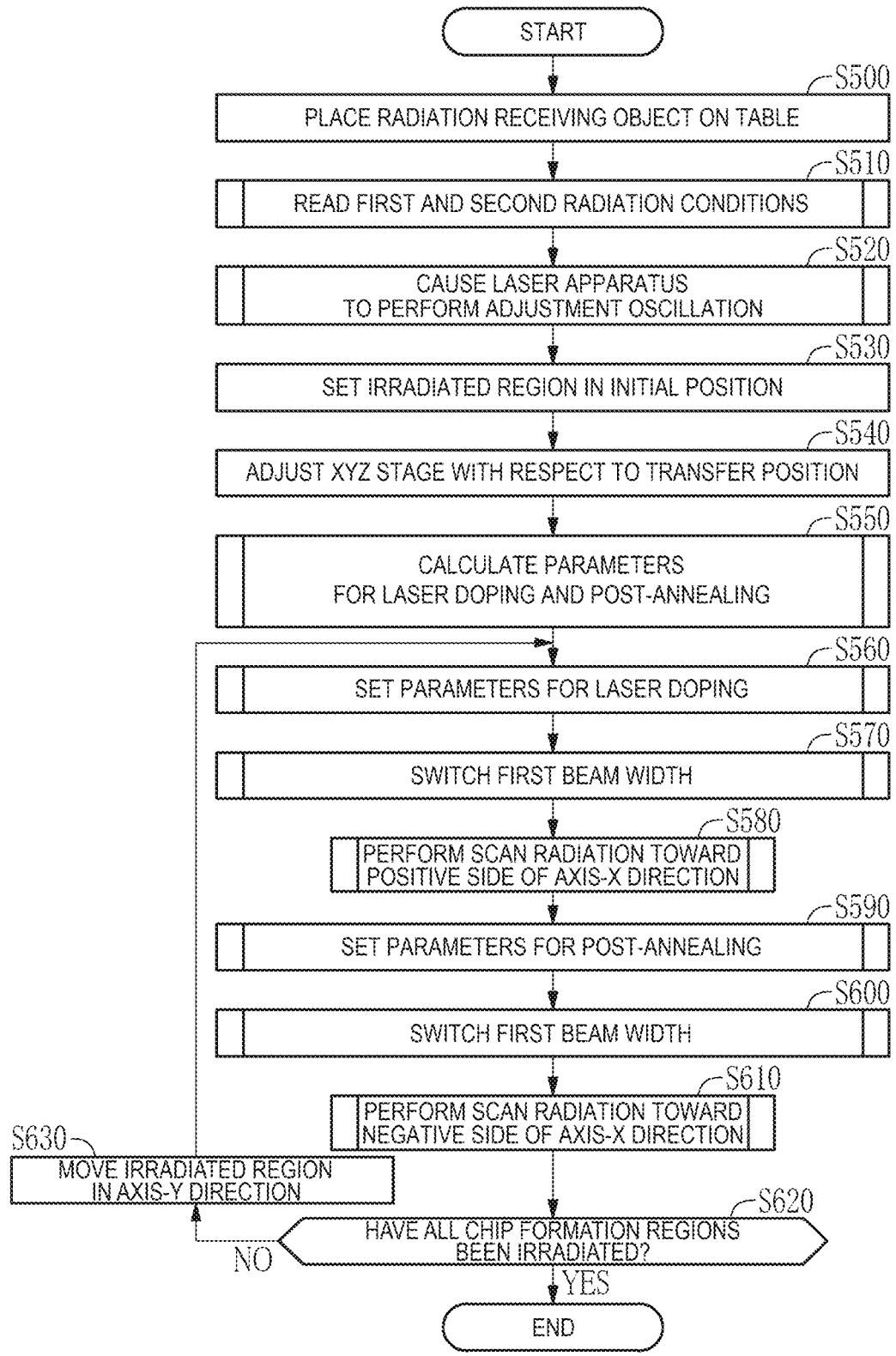
FIG. 28 is a flowchart showing the processes in the laser doping control and the post-annealing control performed by the laser radiation controller.

FIG. 28 is a flowchart showing the processes in the laser doping control and the post-annealing control performed by the laser radiation controller 31. Steps S500 to S570 in the present embodiment are the same as steps S300 to S370 in the first embodiment. In the present embodiment, the parameters for laser doping are set in step S560, and the first beam width is switched to the first beam width Bdx for laser doping in step S570. The laser radiation controller 31 then performs the scan radiation corresponding to one row toward the positive side of the axis-X direction at the first scan speed Vdx (step S580).

When the scan radiation corresponding to one row toward the positive side of the axis-X direction is completed, the laser radiation controller 31 sets the parameters for post-annealing in the laser radiation apparatus 4b (step S590). The laser radiation controller 31 then switches the first beam width to the first beam width Bpx for post-annealing (step S600) and performs the scan radiation corresponding to one row toward the negative side of the axis-X direction at the second scan speed Vpx (step S610). Whenever the scan radiation corresponding to one row toward any of the positive and negative sides of the axis-X direction is completed, the laser radiation controller 31 evaluates whether or not all the chip formation regions 53 have been irradiated (step S620).

In a case where all the chip formation regions 53 have not been irradiated (NO in step S620), the laser radiation controller 31 moves the irradiated region in the axis-Y direction and sets the irradiated region in the scan radiation start position in the next row (step S630). The laser radiation controller 31 then returns to the process in step S560 and repeatedly carries out the same processes described above. In a case where all the chip formation regions 53 have been irradiated (YES in step S620), the laser radiation controller 31 terminates the scan radiation control.

5.3 Effects

In the scan radiation control according to the present variation, in which the distance over which the XYZ stage 33 is moved in the axis-Y direction is shortened as compared with those according to the first and second embodiments, the throughput of the laser radiation system is further improved. Further, since the scan radiation for laser doping and the scan radiation for post-annealing are continuously performed on a row basis, the irradiated region in the laser doping and the irradiated region in the post-annealing coincide with each other in the axis-Y direction with improved precision.

6. Second Variation

A second variation will next be described. In the first embodiment, the beam homogenizer 43a is disposed in the optical path between the high-reflectance mirrors 41b and 41c, as shown in FIG. 3, but the position where the beam homogenizer 43a is disposed in not limited thereto.

Figure 29:
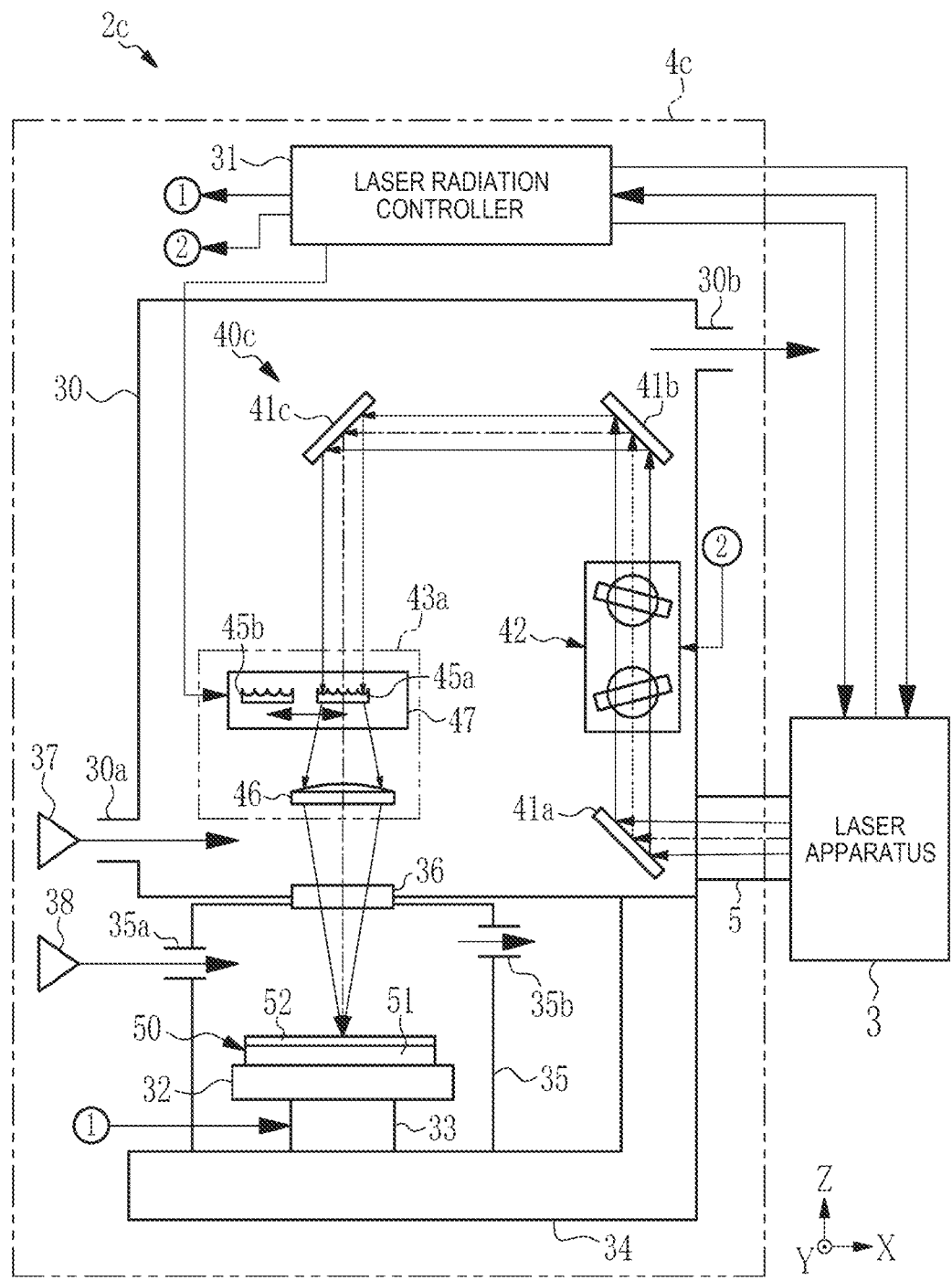
FIG. 29 schematically shows the configuration of a laser radiation system according to a second variation.

FIG. 29 schematically shows the configuration of a laser radiation system 2c according to the present variation. The configuration of the laser radiation system 2c differs from the configuration of the laser radiation system 2 according to the first embodiment only in terms of the configuration of an optical system 40c provided in a laser radiation apparatus 4c. In the optical system 40c, the beam homogenizer 43a is disposed in the optical path between the high-reflectance mirror 41c and the window 36, unlike in the transfer optical system 44 described before.

The beam homogenizer 43a includes the first fly-eye lens 45a, the second fly-eye lens 45b, the uniaxial movement stage 47, and the condenser lens 46, as in the first embodiment. The laser radiation controller 31 is configured to control the uniaxial movement stage 47 to insert one of the first fly-eye lens 45a and the second fly-eye lens 45b into the optical path of the pulsed laser light. In the present variation, the condenser lens 46 is so disposed that the focal plane thereof coincides with the surface of the radiation receiving object 50. The condenser lens 46 illuminates the surface of the radiation receiving object 50 with the pulsed laser light in the form of Koehler illumination.

The other configurations of the laser radiation system 2c according to the present variation are the same as those of the laser radiation system 2 according to the first embodiment.

Further, the beam homogenizer 43b described in the second embodiment may be disposed in the optical path between the high-reflectance mirror 41c and the window 36 in place of the transfer optical system 44, as in the present variation.

7. Third Embodiment 7.1 Configuration

Figure 30:
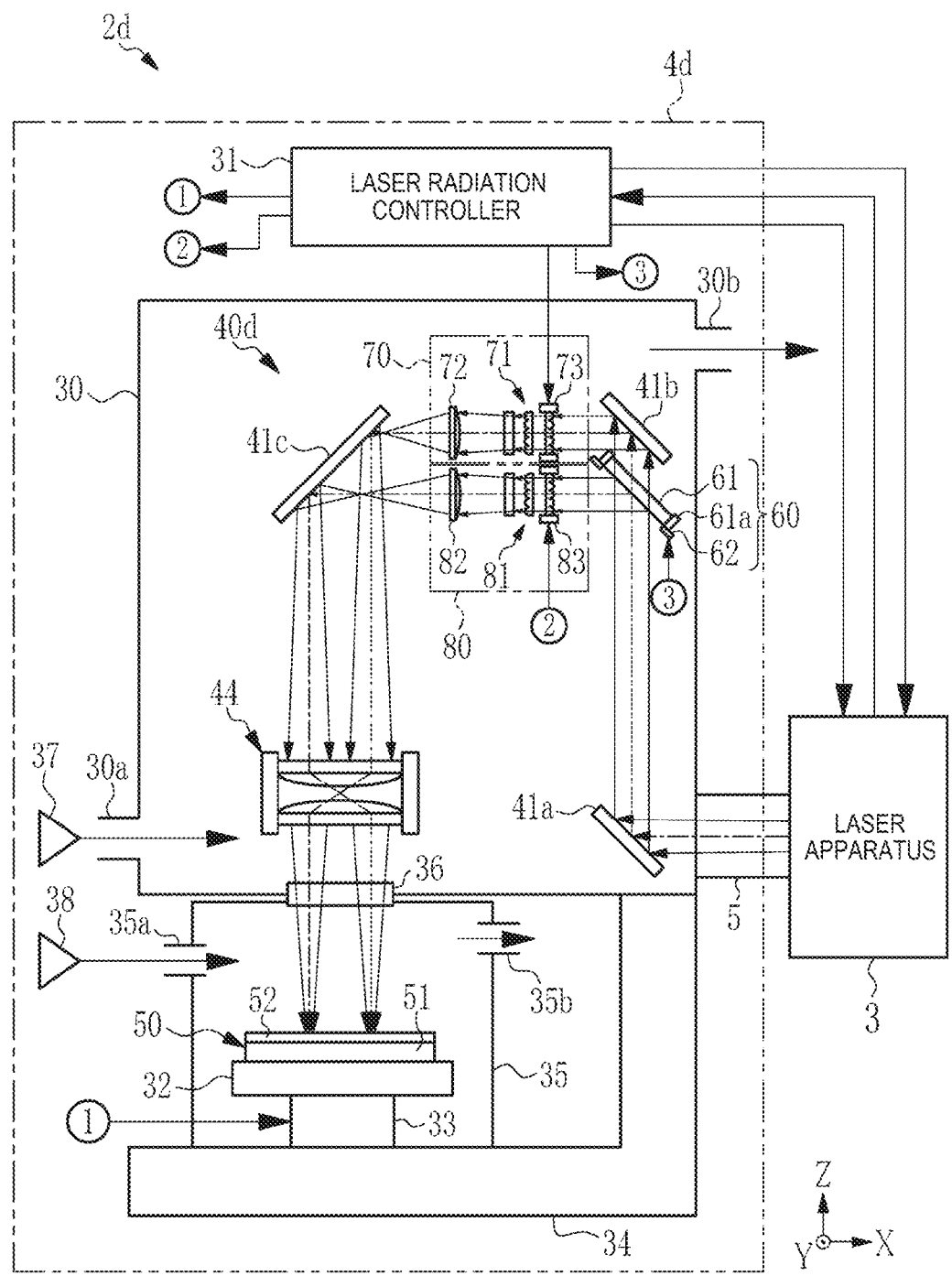
FIG. 30 schematically shows the configuration of a laser radiation system according to a third embodiment.

FIG. 30 schematically shows the configuration of a laser radiation system 2d according to a third embodiment of the present disclosure. The laser radiation system 2d according to the third embodiment includes a laser radiation apparatus 4d in place of the laser radiation apparatus 4b provided in the laser radiation system 2b according to the second embodiment. In the following description, substantially the same portions as the components of the laser radiation system 2b according to the second embodiment have the same reference characters and will not be described as appropriate.

Figure 31:
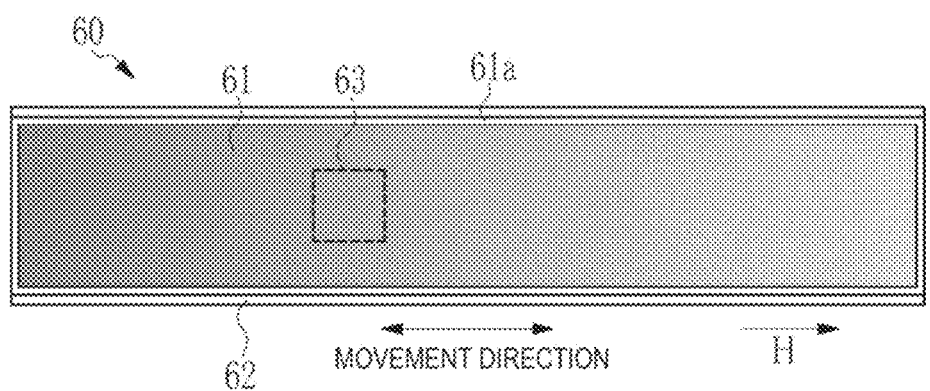
FIG. 31 shows the configuration of a reflectance variable beam splitter.

The laser radiation system 2d includes the laser apparatus 3 and the laser radiation apparatus 4d. The laser apparatus 3 has the same configuration as that of the laser apparatus 3 in the first embodiment. The laser radiation apparatus 4d includes a reflectance variable beam splitter 60 disposed in the optical path between the high-reflectance mirrors 41a and 41b in an optical system 40d. The optical system 40d includes a first beam homogenizer 70 for laser doping and a second beam homogenizer 80 for post-annealing in place of the beam homogenizer 43b in the second embodiment. FIG. 31 shows the configuration of the reflectance variable beam splitter 60.

FIG. 31 shows the reflectance variable beam splitter 60 viewed along the direction labeled with the arrow a in FIG. 32, which will be described later. The reflectance variable beam splitter 60 is formed of a partial reflection mirror 61, a holder 61a, and a uniaxial movement stage 62. The partial reflectance mirror 61 has an oblong shape and has reflectance that monotonously decreases along the axis-H direction, which is the longitudinal direction of the partial reflection mirror 61. The holder 61a is configured to hold an outer edge portion of the partial reflection mirror 61. The uniaxial movement stage 62 is configured to engage with the holder 61a and move the partial reflection mirror 61 in the axis-H direction based on a control signal inputted from the laser radiation controller 31.

Reference character 63 represents a light incident region on which the pulsed laser light incident on the partial reflection mirror 61 from the laser apparatus 3 via the optical path tube 5 and the high-reflectance mirror 41a is incident. The position of the light incident region 63 changes when the uniaxial movement stage 62 is driven to move the partial reflection mirror 61 in the axis-H direction. That is, moving the partial reflection mirror 61 in the axis-H direction changes reflectance R of light reflected off the light incident region 63. The partial reflection mirror 61 is configured to transmit part of the pulsed laser light incident on the light incident region 63 and reflect another part of the pulsed laser light.

Figure 32:
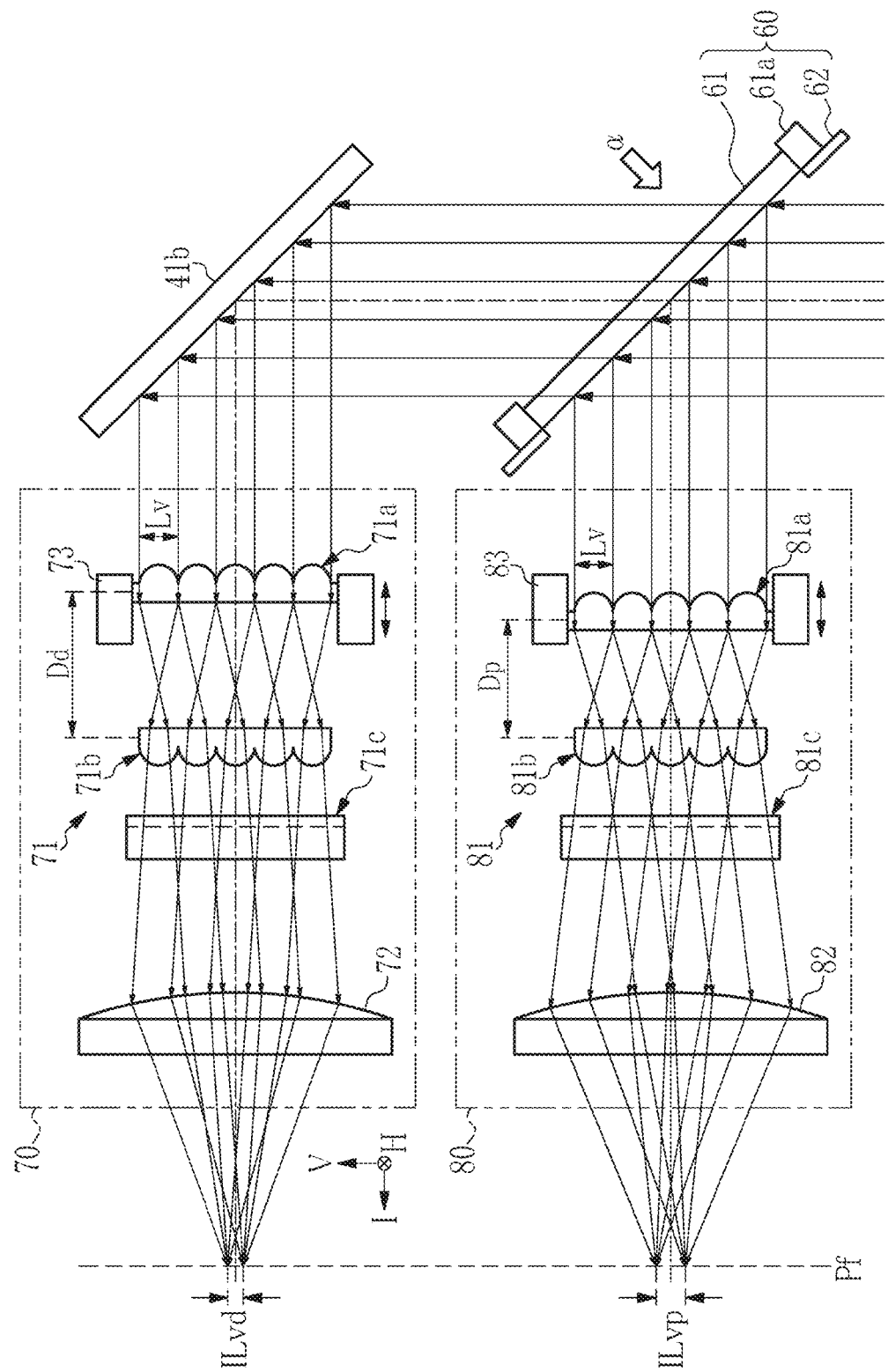
FIG. 32 shows the configuration of first and second beam homogenizers.

FIG. 32 shows the configuration of the first beam homogenizer 70 and the second beam homogenizer 80. The first beam homogenizer 70 is disposed in the optical path of the transmitted light passing through the partial reflection mirror 61. The transmitted light is reflected off the high-reflectance mirror 41b and enters the first beam homogenizer 70. The second beam homogenizer 80 is disposed in the optical path of the reflected light reflected off the partial reflection mirror 61.

Assuming that the pulsed laser light incident on the partial reflection mirror 61 has the pulse energy Et, the pulsed laser light that enters the first beam homogenizer 70 has pulse energy (1−R)Et. The pulsed laser light that enters the second beam homogenizer 80 has pulse energy R·Et.

The first beam homogenizer 70 includes a cylindrical lens group 71, a condenser lens 72, and a uniaxial movement stage 73 as a third actuator. The cylindrical lens group 71 forms a fly-eye lens. The cylindrical lens group 71 includes a first cylindrical lens array 71a, a second cylindrical lens array 71b, and a third cylindrical lens array 71c. The configuration of the first beam homogenizer 70 is the same as the configuration of the beam homogenizer 43b in the second embodiment.

The uniaxial movement stage 73 moves the first cylindrical lens array 71a in the axis-I direction to change the gap Dd between the first cylindrical lens array 71a and the second cylindrical lens array 71b. Changing the gap Dd allows control of a beam width ILvd of the pulsed laser light in the axis-V direction in a focal plane Pf of the condenser lens 72.

Figure 33A:
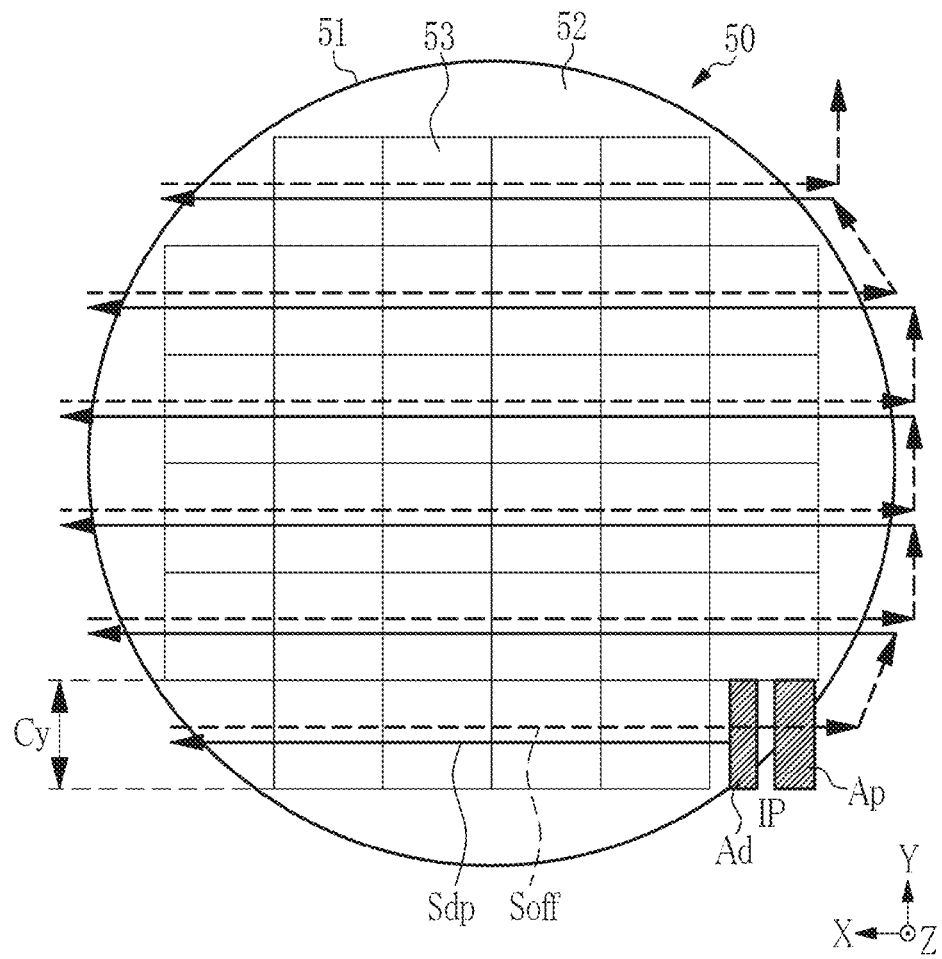
FIG. 33A shows a scan path.
Figure 33B:
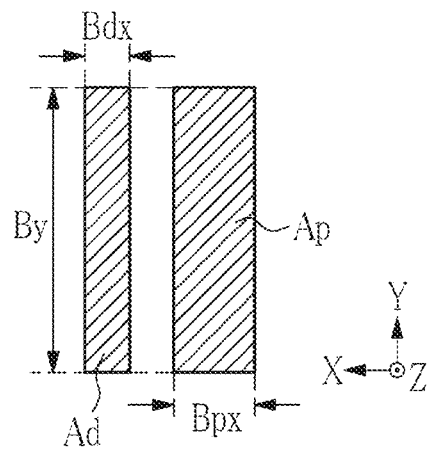
FIG. 33B shows the shape of the irradiated region.

Reference character Ad shown in FIGS. 33A and 33B represents the beam shape of the pulsed laser light which travels from the first beam homogenizer 70 via the high-reflectance mirror 41c and the transfer optical system 44 and with which the radiation receiving object 50 is irradiated, that is, the irradiated region. The first beam width Bdx, which is the width of the irradiated region Ad in the axis-X direction, and the beam width ILvd relate to each other in the relationship expressed by Expression (23) below.

$$Bdx = M \cdot ILvd \qquad (23)$$

The first beam width Bdx for laser doping can therefore be controlled by changing the gap Dd.

The second beam homogenizer 80 includes a cylindrical lens group 81, a condenser lens 82, and a uniaxial movement stage 83 as a fourth actuator. The cylindrical lens group 81 forms a fly-eye lens. The cylindrical lens group 81 includes a fourth cylindrical lens array 81a, a fifth cylindrical lens array 81b, and a sixth cylindrical lens array 81c. The configuration of the second beam homogenizer 80 is the same as the configuration of the beam homogenizer 43b in the second embodiment.

The uniaxial movement stage 83 moves the fourth cylindrical lens array 81a in the axis-I direction to change the gap Dp between the fourth cylindrical lens array 81a and the fifth cylindrical lens array 81b. Changing the gap Dp allows control of a beam width ILvp of the pulsed laser light in the axis-V direction in a focal plane Pf of the condenser lens 82.

Reference character Ap shown in FIGS. 33A and 33B represents the beam shape of the pulsed laser light which travels from the second beam homogenizer 80 via the high-reflectance mirror 41c and the transfer optical system 44 and with which the radiation receiving object 50 is irradiated, that is, the irradiated region. The first beam width Bpx, which is the width of the irradiated region Ap in the axis-X direction, and the beam width ILvp relate to each other in the relationship expressed by Expression (24) below.

$$Bpx = M \cdot ILvp \qquad (24)$$

The first beam width Bpx for post-annealing can therefore be controlled by changing the gap Dp.

The irradiated region Ad and the irradiated region Ap have the same width in the axis-Y direction, that is, the second beam width By.

7.2 Scan Radiation Control

Scan radiation control performed by the laser radiation controller 31 in the present embodiment will next be described. In the present embodiment, the XYZ stage 33 moves the radiation receiving object 50 at a fixed speed with the irradiated region Ad irradiated with the pulsed laser light for laser doping and the irradiated region Ap irradiated with the pulsed laser light for post-annealing. That is, in the present embodiment, the scan radiation using the beam for laser doping and the scan radiation using the beam for post-annealing are simultaneously performed.

Specifically, the irradiated region Ad for laser doping and the irradiated region Ap for post-annealing are so set on the surface of the radiation receiving object 50 as to be adjacent to each other in the axis-X direction. The irradiated region Ad is shifted from the irradiated region Ap toward the front side of the scan direction. That is, the laser radiation controller 31 is configured to control the XYZ stage 33 to linearly move the radiation receiving object 50 at a fixed scan speed Vx in such a way that the irradiated region Ad passes through each of the chip formation regions 53 before the irradiated region Ap. The laser radiation controller 31 is configured to perform the scan radiation on a row basis toward the positive side of the axis-X direction and, whenever one-row scan radiation ends, further configured to stop the radiation of the pulsed laser light and cause the irradiated region to return to the front end of the row. In FIG. 33A, reference character Sdp represents the path of the scan radiation. Reference character Soff represents the path where the radiation of the pulsed laser light is stopped and along which the XYZ stage 33 is moved.

7.3 Method for Setting Reflectance

A method for setting the reflectance R of light reflected off the light incident region 63 based on the first and second radiation conditions will next be described. In the present embodiment, the fluence Fd in the laser doping is expressed by Expression (25) below. The fluence Fp in the post-annealing is expressed by Expression (26) below.

$$Fd = (1-R)Et/(Bdx \cdot By) \qquad (25)$$

$$Fp = R \cdot Et/(Bpx \cdot By) \qquad (26)$$

Expression (27) below is derived from Expressions (25) and (26) described above.

$$\alpha = Fp/Fd = (R/(1-R))(Bdx/Bpx) \quad (27)$$

In the present embodiment, since the same scan speed is used in both the laser doping and the post-annealing, that is, Vx=Vdx=Vpx, Expression (28) below is derived from Expressions (12) and (14) described before.

$$\beta = Np/Nd = Bpx/Bdx \quad (28)$$

Expression (29) below is derived from Expressions (27) and (28) described above.

$$R = \alpha \cdot \beta / (1+\beta) \quad (29)$$

The reflectance R can therefore be calculated based on Expressions (27) to (29) described above by using the first fluence Fd and the first number of radiated pulses Nd contained in the first radiation condition and the second fluence Fp and the second number of radiated pulses Np contained in the second radiation condition.

The laser radiation controller 31 is configured to set the reflectance R by driving the uniaxial movement stage 62 provided in the reflectance variable beam splitter 60 to move the partial reflection mirror 61 to a position where the reflectance R of light reflected off the light incident region 63 is the value calculated as described above.

7.4 Operation of Laser Radiation System
7.4.1 Main Procedure

Figure 34:
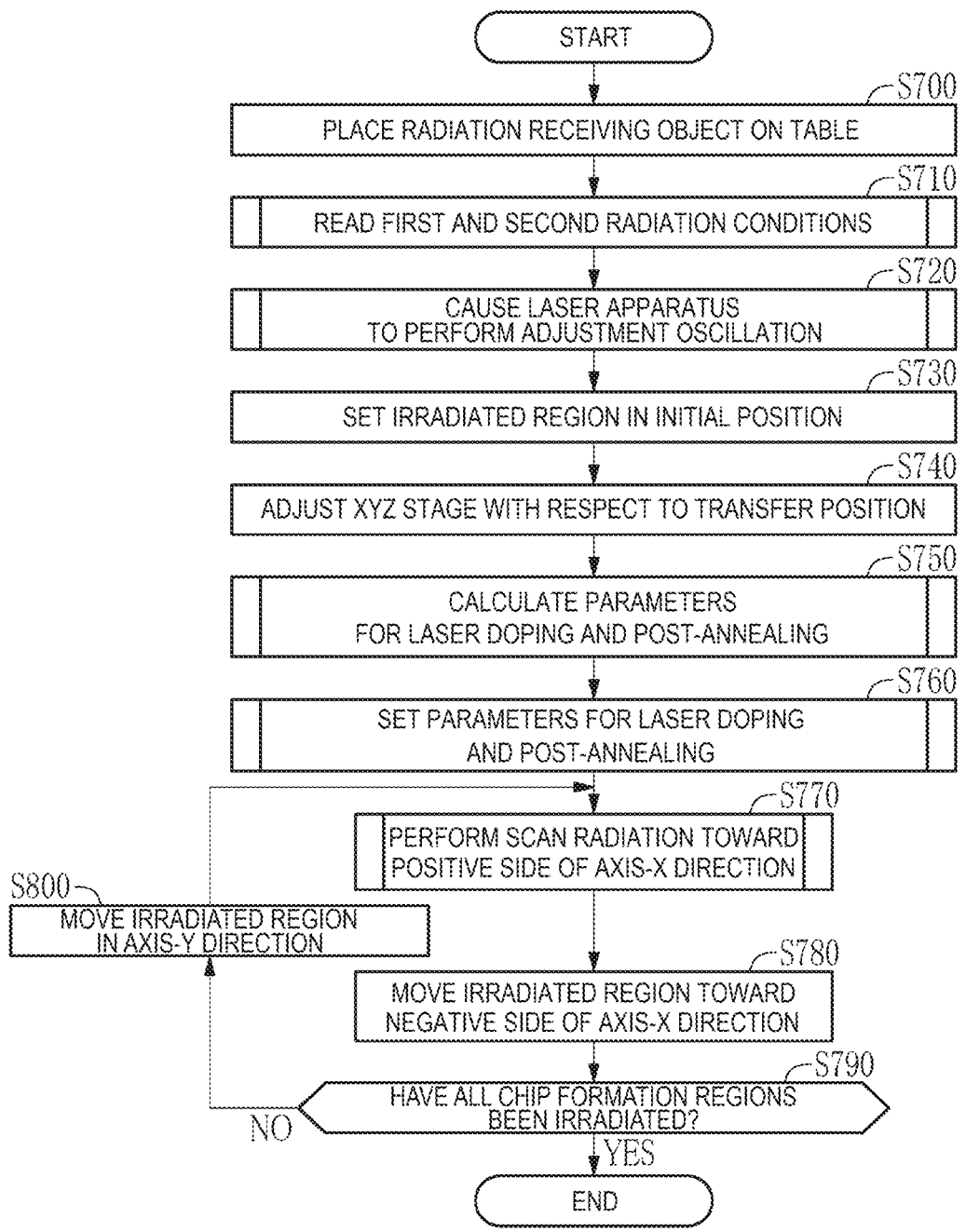
FIG. 34 is a flowchart showing the processes in the laser doping control and the post-annealing control performed by the laser radiation controller.

FIG. 34 is a flowchart showing the processes in the laser doping control and the post-annealing control performed by the laser radiation controller 31. Steps S700 to S740 in the present embodiment are the same as steps S300 to S340 in the first embodiment. In the present embodiment, the laser radiation controller 31 is configured to calculate the parameters for laser doping and post-annealing after step S740 (step S750) and set the calculated parameters in the laser radiation apparatus 4d (step S760).

The laser radiation controller 31 then performs the scan radiation in which the radiation receiving object 50 is irradiated with the pulsed laser light while moving both the irradiated regions Ad and Ap toward the positive side of the axis-X direction at a fixed speed along a scan path Sdp (step S770). When the scan radiation corresponding to one row toward the positive side of the axis-X direction is completed, the laser radiation controller 31 moves the irradiated regions Ad and Ap toward the negative side of the axis-X direction along the path Soff (step S780).

The laser radiation controller 31 then evaluates whether or not all the chip formation regions 53 have been irradiated (step S790). In a case where all the chip formation regions 53 have not been irradiated (NO in step S790), the laser radiation controller 31 moves the irradiated regions Ad and Ap in the axis-Y direction and sets the irradiated regions in the scan radiation start position in the next row (step S800). The laser radiation controller 31 then returns to the process in step S770 and repeatedly carries out the same processes described above. In a case where all the chip formation regions 53 have been irradiated (YES in step S790), the laser radiation controller 31 terminates the scan radiation control.

7.4.2 Details of S750

Figure 35:
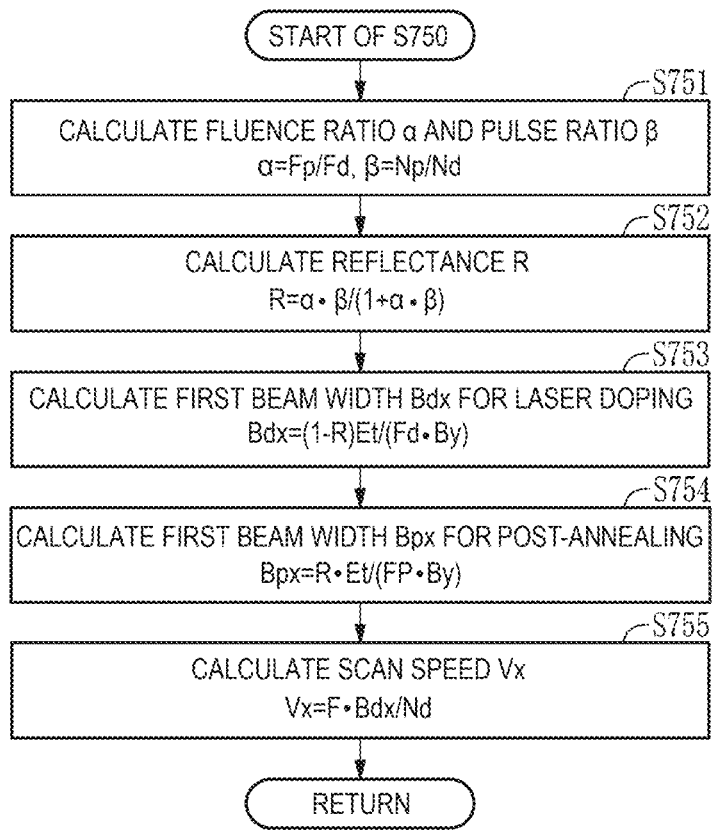
FIG. 35 shows a subroutine illustrating the details of the process of calculating the parameters for laser doping and post-annealing.

FIG. 35 shows a subroutine illustrating the details of the process of calculating the parameters for laser doping and post-annealing (step S750) in the main procedure shown in FIG. 34. In step S750, the laser radiation controller 31 first calculates the ratio a between the first fluence Fd and the second fluence Fp and the ratio 13 between the first number of radiated pulses Nd and the second number of radiated pulses Np (step S751). The laser radiation controller 31 then calculates the reflectance R based on Expression (29) described above (step S752).

The laser radiation controller 31 then calculates the first beam width Bdx for laser doping based on Expression (30) below (step S753), which is the deformation of Expression (25) described above.

$$Bdx = (1-R)Et/(Fd \cdot By) \quad (30)$$

The laser radiation controller 31 further calculates the first beam width Bpx for post-annealing based on Expression (31) below (step S754), which is the deformation of Expression (26) described above.

$$Bpx = R \cdot Et/(Fp \cdot By) \quad (31)$$

The laser radiation controller 31 then calculates the scan speed Vx based on Expression (32) below (step S755).

$$Vx = f \cdot Bdx/Nd \quad (32)$$

The laser radiation controller 31 then returns to the processes in the main procedure.

7.4.3 Details of S760

Figure 36:
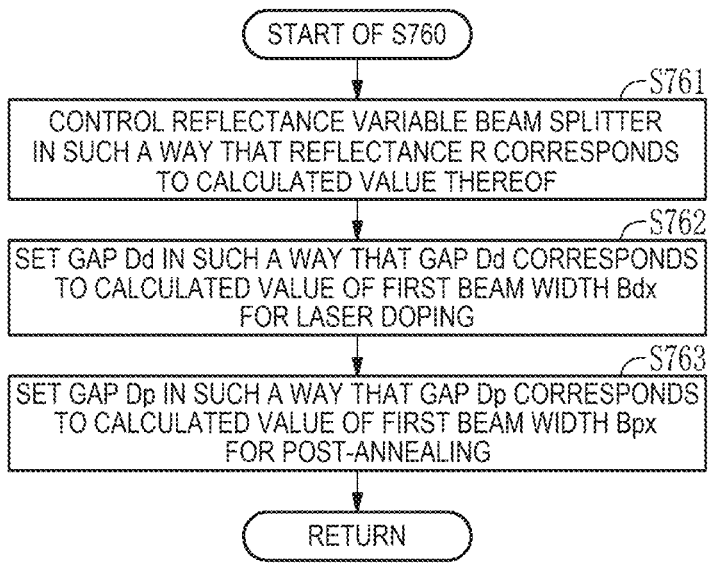
FIG. 36 shows a subroutine illustrating the details of the process of setting the parameters for laser doping and post-annealing.

FIG. 36 shows a subroutine illustrating the details of the process of setting the parameters for laser doping and post-annealing (step S760) in the main procedure shown in FIG. 34. In step S760, the laser radiation controller 31 first controls the uniaxial movement stage 62 provided in the reflectance variable beam splitter 60 to move the partial reflection mirror 61 to a position where the reflectance R of light reflected off the light incident region 63 is the value calculated in step S752 (step S761).

The laser radiation controller 31 then controls the uniaxial movement stage 73 provided in the first beam homogenizer 70 to set the gap Dd in such a way that the gap Dd corresponds to the calculated value of the first beam width Bdx calculated in step S753 (step S762). The laser radiation controller 31 further controls the uniaxial movement stage 83 provided in the second beam homogenizer 80 to set the gap Dp in such a way that the gap Dp corresponds to the calculated value of the first beam width Bpx calculated in step S754 (step S763). The laser radiation controller 31 then returns to the processes in the main procedure.

The details of step S770 are the same as the details of step S170 described in the first embodiment and will therefore not be described. In the present embodiment, the laser radiation controller 31 is configured to set the XYZ stage 33 in such a way that the speed of the fixed-speed linear motion is the scan speed Vx calculated in step S755 and perform the scan radiation toward the positive side of the axis-X direction.

7.5 Effects

In the present embodiment, the laser doping and the post-annealing can be performed by a single scan radiation action. Further, in the present embodiment, the pulsed laser light supplied from the laser apparatus 3 is divided by the reflectance variable beam splitter 60, with one of the divided beams used as the beam for laser doping and the other beam used as the beam for post-annealing, whereby the pulse energy is used efficiently.

In the present embodiment, the reflected light reflected off the reflectance variable beam splitter 60 is used as the beam for laser doping, and the transmitted light having passed through the reflectance variable beam splitter 60 is used as the beam for post-annealing. Conversely, the transmitted light may be used as the beam for laser doping, and the reflected light may be used as the beam for post-annealing.

In the present embodiment, the scan radiation is performed only toward the positive side of the axis-X direction. Instead, first scan radiation toward the positive side of the axis-X direction and second scan radiation toward the negative side of the axis-X direction may be alternately performed on a row basis. In this case, the first scan radiation and the second scan radiation need to be so performed that the positional relationship between the irradiated region Ad and the irradiated region Ap in the axis-X direction is reversed. That is, it is necessary in the second scan radiation that the second beam homogenizer 80 is used for the laser doping and the first beam homogenizer 70 is used for the post-annealing.

To this end, in the second scan radiation, the reflectance R may be calculated based on Expression (29) described above under the following conditions: $\alpha=Fd/Fp$; and $\beta=Nd/Np$. Further, in this case, the first beam width Bdx of the beam for laser doping satisfies Expression (33) below. The first beam width Bpx of the beam for post-annealing satisfies Expression (34) below.

$$Bdx = R \cdot Et/(Fd \cdot By) \tag{33}$$

$$Bpx = (1-R)Et/(Fp \cdot By) \tag{34}$$

In the present embodiment, the first beam homogenizer 70 for laser doping includes the cylindrical lens group 71, and the second beam homogenizer 80 for post-annealing includes the cylindrical lens group 81. The first fly-eye lens 45a may be disposed in a fixed position in place of the cylindrical lens group 71, and the second fly-eye lens 45b may be disposed in a fixed position in place of the cylindrical lens group 81.

Table 3 below shows a specific example of the parameters in the laser doping and the post-annealing in the third embodiment in the case where Et=100 mJ. Table 4 below shows a specific example of the parameters in the laser doping and the post-annealing in the third embodiment in the case where Et=40 mJ.

TABLE 3

| Laser doping | | Post-Annealing | |
|---|---|---|---|
| Et | 100 mJ | Et | 100 mJ |
| f | 6000 Hz | f | 6000 Hz |
| Bdy | 10 mm | Bpy | 10 mm |
| Nd | 10 pulses | Np | 100 pulses |
| Fd | 6 J/cm² | Fp | 4 J/cm² |
| Bdx | 0.02 mm | Bpx | 0.22 mm |
| Vx | 13 mm/s | Vx | 13 mm/s |
| R | 0.87 | R | 0.87 |

TABLE 4

| Laser doping | | Post-Annealing | |
|---|---|---|---|
| Et | 40 mJ | Et | 40 mJ |
| f | 4000 Hz | f | 4000 Hz |
| Bdy | 10 mm | Bpy | 10 mm |
| Nd | 10 pulses | Np | 100 pulses |
| Fd | 6 J/cm² | Fp | 4 J/cm² |
| Bdx | 0.01 mm | Bpx | 0.09 mm |
| Vx | 3.48 mm/s | Vx | 3.48 mm/s |
| R | 0.87 | R | 0.87 |

Tables 3 and 4 show that the laser doping and the post-annealing can be performed in the present embodiment even when the pulsed laser light has low pulse energy, such as 100 mJ or 40 mJ. The fluence Fd in the laser doping and the fluence Fp in the post-annealing are settable by adjustment of the beam width Bdx in the scan radiation direction and the reflectance R, as described above. The values of the beam width Bdx and the reflectance R in Tables 3 and 4 are adequately adjustable values. Further, the scan speeds Vx in Tables 3 and 4 are adequately adjustable values.

8. Fourth Embodiment

8.1 Configuration

Figure 37:
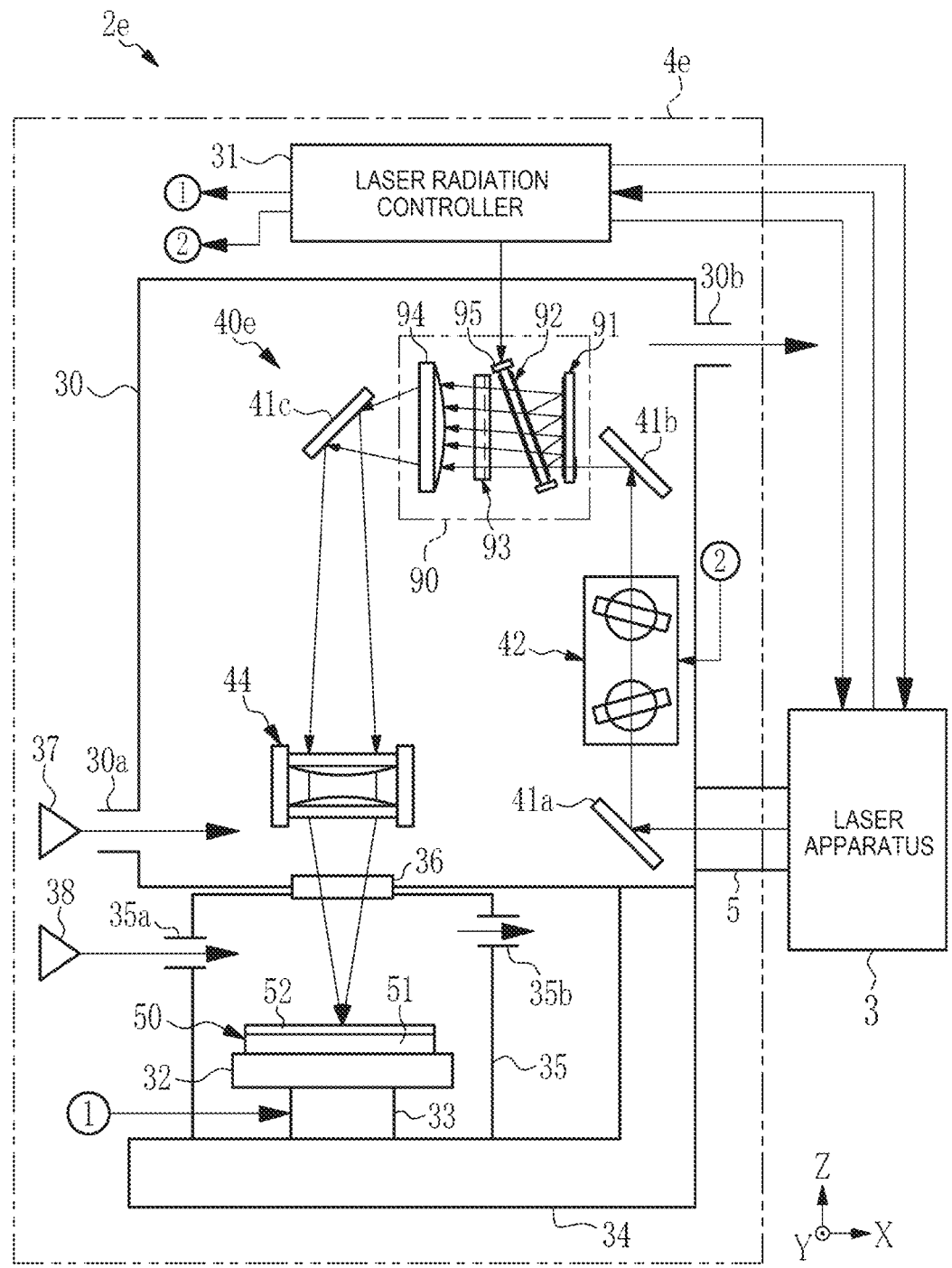
FIG. 37 schematically shows the configuration of a laser radiation system according to a fourth embodiment.

FIG. 37 schematically shows the configuration of a laser radiation system 2e according to a fourth embodiment of the present disclosure. The laser radiation system 2e according to the fourth embodiment includes a laser radiation apparatus 4e in place of the laser radiation apparatus 4a provided in the laser radiation system 2a according to the first embodiment. In the following description, substantially the same portions as the components of the laser radiation system 2a according to the first embodiment have the same reference characters and will not be described as appropriate.

The laser radiation system 2e includes the laser apparatus 3 and the laser radiation apparatus 4e. The laser apparatus 3 has the same configuration as that of the laser apparatus 3 in the first embodiment. The laser radiation apparatus 4e includes a beam homogenizer 90 in an optical system 40e in place of the beam homogenizer 43 in Comparative Example.

Figure 38A:
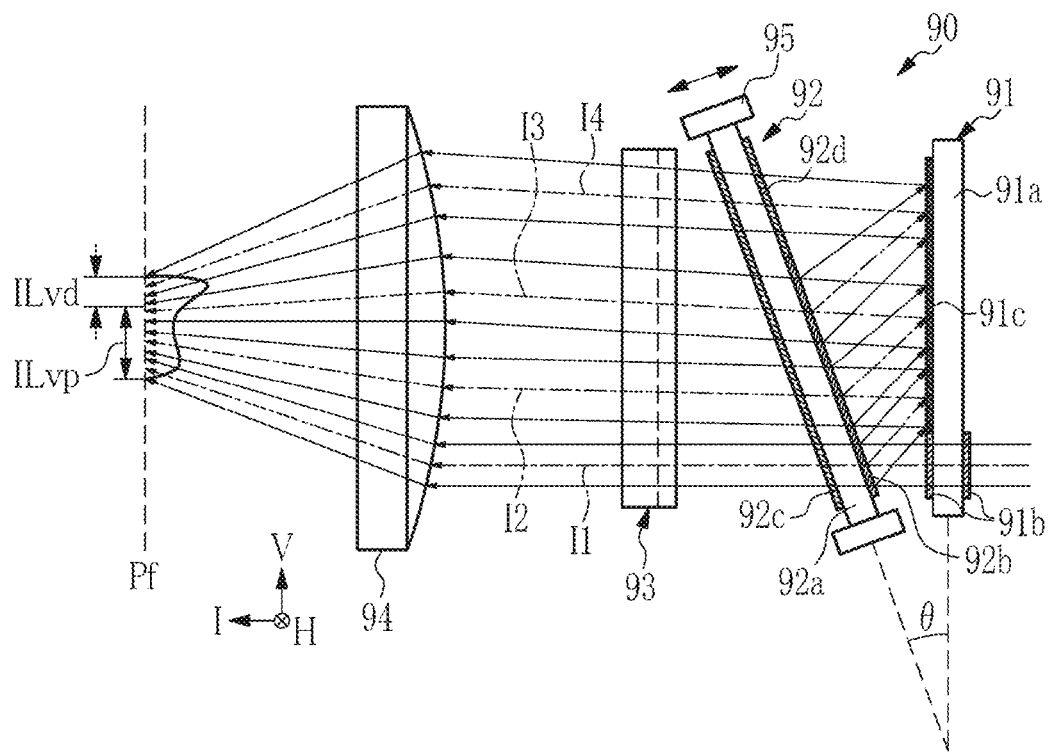
FIG. 38A shows the beam homogenizer viewed along the axis-H direction.
Figure 38B:
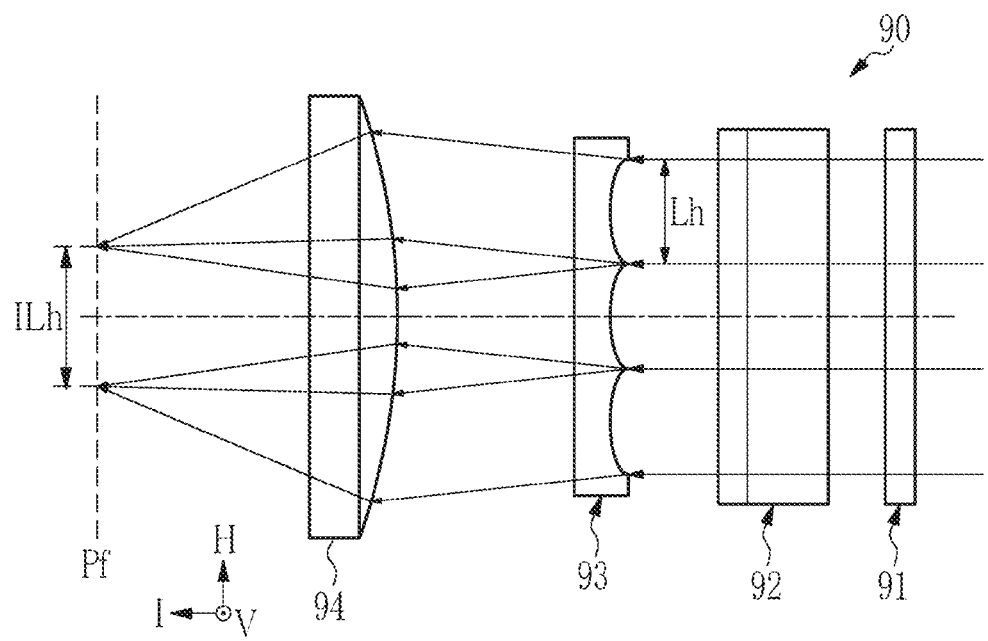
FIG. 38B shows the beam homogenizer viewed along the axis-V direction.

The beam homogenizer 90 includes a high-reflectance mirror 91, a partial reflection mirror 92, a cylindrical array 93, a condenser lens 94, and a rotary stage 95, as shown in FIGS. 38A and 38B. The high-reflectance mirror 91, the partial reflection mirror 92, the cylindrical array 93, and the condenser lens 94 are disposed in the optical path of the pulsed laser light in the presented order from the side on the upstream of the optical path.

The high-reflectance mirror 91 is formed of reflection suppression films 91b and a high-reflectance film 91c formed on a transparent parallel plate substrate 91a. The high-reflectance mirror 91 is so disposed that the opposite surfaces of the parallel plate substrate 91a are substantially parallel to the plane VH. The reflection suppression films 91b are formed on the opposite surfaces of the parallel plate substrate 91a in the region where the pulsed laser light reflected off the high-reflectance mirror 41b is incident on the parallel plate substrate 91a. The high-reflectance film 91c is formed in the region on which the light reflected off the partial reflection mirror 92 is incident.

The partial reflection mirror 92 is formed of a partial reflection film 92b, a first reflection suppression film 92c, and a second reflection suppression film 92d formed on a transparent parallel plate substrate 92a. The partial reflection mirror 92 is so disposed as not to be parallel to the high-reflectance mirror 91 but as to rotate around the axis H. The partial reflection film 92b is formed on a surface of the parallel plate substrate 92a that is the surface facing the high-reflectance mirror 91. The first reflection suppression film 92c is formed on a surface of the parallel plate substrate 92a that is the surface facing the cylindrical array 93. The second reflection suppression film 92d is formed in a region which faces the high-reflectance mirror 91 and on which the pulsed laser light partially reflected repeatedly three times off the partial reflection film 92b is incident. The rotary stage 95 is configured to hold the partial reflection mirror 92 rotatably around the axis H. The rotary stage 95 is configured to rotate the partial reflection mirror 92 based on a control signal inputted from the laser radiation controller 31 to change an angle θ between the partial reflection mirror 92 and the high-reflectance mirror 91.

The cylindrical array 93 and the condenser lens 94 have the same configurations as those of the third cylindrical lens array 48c and the condenser lens 46 according to the second embodiment, respectively.

8.2 Operation

The operation of the laser radiation system 2e will next be described. The pulsed laser light that exits out of the laser apparatus 3 and enters the laser radiation apparatus 4e is reflected off the high-reflectance mirror 41a and incident on the high-reflectance mirror 41b via the attenuator 42. The pulsed laser light incident on the high-reflectance mirror 41b is reflected off the high-reflectance mirror 41b and enters the beam homogenizer 90.

The pulsed laser light having entered the beam homogenizer 90 is incident on the regions where the reflection suppression films 91b are formed on the high-reflectance mirror 91, passes through the high-reflectance mirror 91, and is incident on the partial reflection mirror 92. Part of the pulsed laser light passes through the partial reflection mirror 92 and exits as first pulsed laser light I1, and another part of the pulsed laser light is reflected off the partial reflection mirror 92.

The reflected light is incident on the high-reflectance mirror 91 and reflected off the high-reflectance film 91c. Part of the reflected light passes through the partial reflection mirror 92 and exits as second pulsed laser light I2, and another part of the reflected light is reflected off the partial reflection mirror 92. The reflected light is incident on the high-reflectance mirror 91 and reflected off the high-reflectance film 91c. Part of the reflected light passes through the partial reflection mirror 92 and exits as third pulsed laser light I3, and another part of the reflected light is reflected off the partial reflection mirror 92.

The reflected light is incident on the high-reflectance mirror 91 and reflected off the high-reflectance film 91c. The reflected light is incident on the region where the second reflection suppression film 92d is formed on the partial reflection mirror 92, passes through the partial reflection mirror 92, and exits as fourth pulsed laser light I4.

The optical path axis of the first pulsed laser light I1 is parallel to the axis I. The optical path axes of the second pulsed laser light I2 to the fourth pulsed laser light I4 incline with respect to the axis I toward the direction V by greater amounts in the presented order. The first pulsed laser light I1 to the fourth pulsed laser light I4 are collected by the condenser lens 94. Specifically, the first pulsed laser light I1 to the fourth pulsed laser light I4 are so collected as to be arranged in the direction V in a focal plane Pf of the condenser lens 94.

For example, in a case where the partial reflection film 92b of the partial reflection mirror 92 has a reflectance of 75% and Et=100 mJ, and it is assumed that optical loss at the partial reflection mirror 92 is ignored, the pulse energy of the first pulsed laser light I1 to the pulse energy of the fourth pulsed laser light I4 are 25 mJ, 25 mJ, 14 mJ, and 42 mJ, respectively. In this case, since the pulse energy of the fourth pulsed laser light I4 is greater than the pulse energy of any other pulsed laser light, the fourth pulsed laser light I4 can be the beam for laser doping, and the first pulsed laser light to the third pulsed laser light can each be the beam for post-annealing.

The collected beams formed of the collected first pulsed laser light I1 to fourth pulsed laser light I4 are transferred by the transfer optical system 44 onto the surface of the radiation receiving object 50. The first fluence Fd provided by the fourth pulsed laser light I4 may satisfy Expression (4) described before. The second fluence Fp provided by the first pulsed laser light I1 to the third pulsed laser light I3 may satisfy Expression (5) or (6) described before. The transmittance of light passing through the attenuator 42 may be so adjusted that the first fluence Fd and the second fluence Fp each have an appropriate value.

In the present embodiment, the V-axis-direction beam width ILvd of the fourth pulsed laser light I4 in the focal plane Pf and the V-axis-direction beam width ILvp of each of the first pulsed laser light I1 to the third pulsed laser light I3 in the focal plane Pf can be adjusted by controlling the rotary stage 95. That is, controlling the rotary stage 95 allows adjustment of the first beam width Bdx for laser doping and the first beam width Bpx for post-annealing.

The scan radiation control in the present embodiment is the same as that in the third embodiment. For example, the scan speed Vx can be set based on Expression (32) described before.

8.3 Effects

In the present embodiment, the beam homogenizer 90 is configured to be capable of causing the beam for laser doping and the beam for post-annealing to be close to each other. Further, in the present embodiment, the beam homogenizer 90, which is smaller than in the third embodiment, can simultaneously generate the beam for laser doping and the beam for post-annealing.

9. Variation of Laser Apparatus

A variety of variations of the laser apparatus 3 in the embodiments described above are conceivable. A variation of the laser apparatus 3 will be described below. FIG. 39 shows the configuration of a laser apparatus 3a according to the present variation. The laser apparatus 3a is the laser apparatus 3 in the first embodiment to which an amplifier PA, which amplifies the energy of the pulsed laser light outputted from the master oscillator MO, is added. The amplifier PA is disposed in the optical path of the pulsed laser light between the master oscillator MO and the OPS 10. The amplifier PA has the same configuration as that of the master oscillator MO except that the amplifier PA includes no optical resonator. The amplifier PA includes the laser chamber 20, the charger 23, and the PPM 24.

Upon reception of the target pulse energy Et and other data from the laser radiation controller 31, the laser controller 13 is configured to control the charging voltage provided by the charger 23 in each of the master oscillator MO and the amplifier PA in such a way that the laser oscillation occurs at the target value.

Upon reception of the light emission trigger Tr from the laser radiation controller 31, the laser controller 13 is configured to control the master oscillator MO and the amplifier PA in such a way that discharge occurs when the pulsed laser light outputted from the master oscillator MO enters the discharge space in the amplifier PA. Specifically, the laser controller 13 is configured to cause a signal synchronous with the light emission trigger Tr to be inputted to the switch 24a in each of the master oscillator MO and the amplifier PA to adjust the on-timing of the switch 24a. As a result, the pulsed laser light having entered the amplifier PA from the master oscillator MO undergoes amplified oscillation in the amplifier PA.

The pulsed laser light amplified and outputted by the amplifier PA enters the monitor module 11 via the OPS 10, and the pulse energy of the pulsed laser light is measured by the monitor module 11. The laser controller 13 is configured to control the charging voltage provided by the charger 23 in each of the master oscillator MO and the amplifier PA in such way that the measured pulse energy approaches the target pulse energy Et. When the shutter 12 opens, the pulsed laser light having passed through the beam splitter 11a in the monitor module 11 enters the laser radiation apparatus 4a.

Providing the amplifier PA as described above allows the laser apparatus 3a to output laser light having high pulse energy.

10. Other Variations

Figure 40:
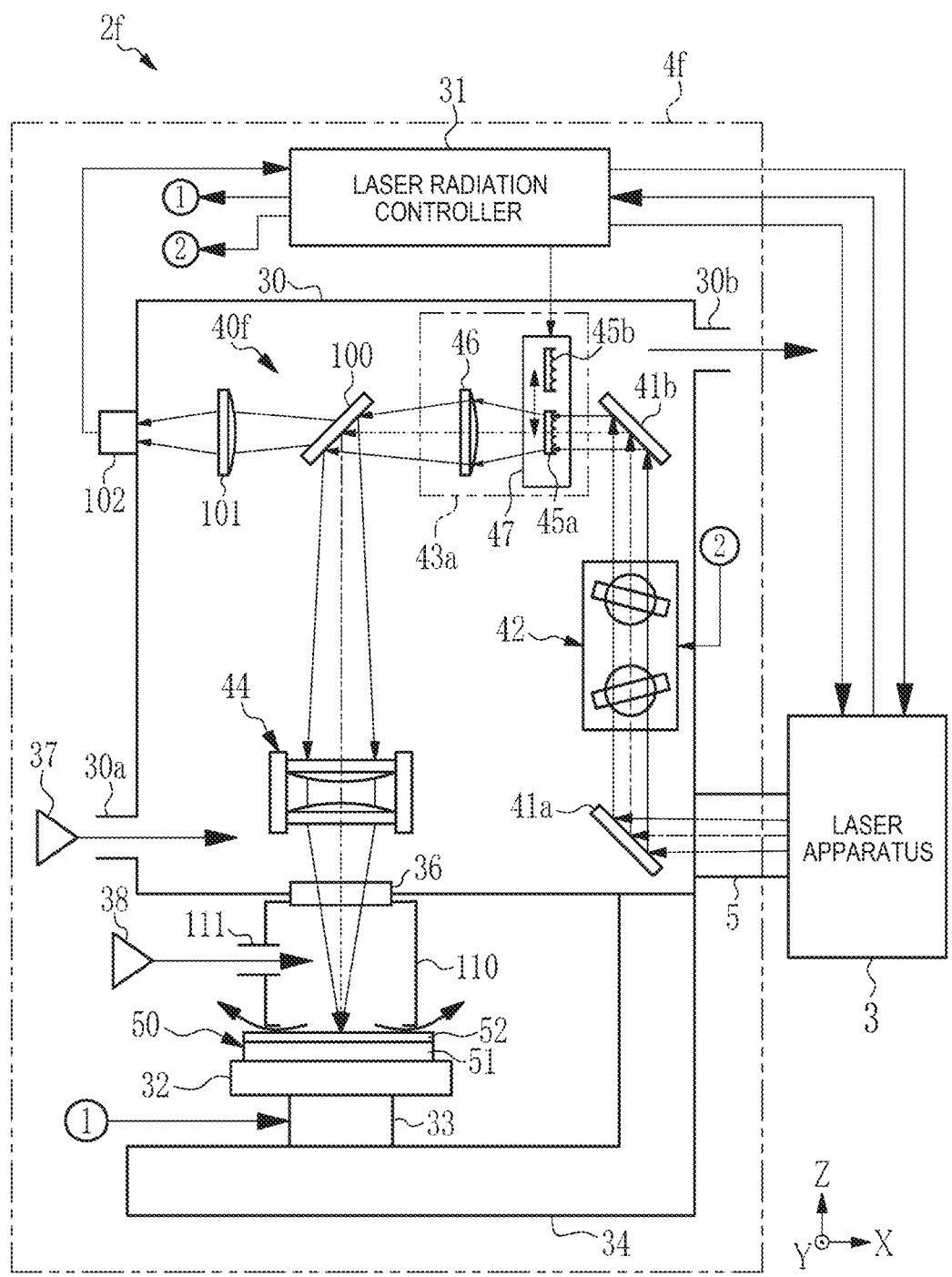
FIG. 40 shows another variation of a laser radiation apparatus.

FIG. 40 shows another variation of the laser radiation apparatus. An optical system 40f provided in a laser radiation apparatus 4f according to the present variation differs from the optical system 40a in the first embodiment in that a beam splitter 100 is provided in place of the high-reflectance mirror 41c. The laser radiation apparatus 4f further includes a condenser lens 101 and an optical sensor 102.

The beam splitter 100 is configured to reflect and guide part of the pulsed laser light incident from the beam homogenizer 43a to the transfer optical system 44, which is configured to transmit part of the pulsed laser light and guide the transmitted pulsed laser light to the condenser lens 101. The condenser lens 101 is configured to collect the light having passed through the beam splitter 100 and cause the collected light to be incident on the optical sensor 102. The optical sensor 102 is configured to measure the pulse energy of the pulsed laser light based on the incident light and input the measured value to the laser radiation controller 31. To suppress a decrease in the light use efficiency, the reflectance of the beam splitter 100 preferably falls within a range greater than or equal to 98% but smaller than 100%.

The laser radiation controller 31 is configured to be capable of controlling the transmittance of light passing through the attenuator 42 based on the measured pulse energy inputted from the optical sensor 102 to control the fluence with high precision. vIn the present variation, a radiation shield 110 is not configured to entirely surround the table 32 and the XYZ stage 33, unlike the radiation shield 35 in the first embodiment, but is configured to surround only a portion containing the radiation position on the radiation receiving object 50. The radiation shield 110 is provided with an intake port 111. The second purge gas supply source 38, which supplies the second purge gas, is connected to the intake port 111. For example, the radiation shield 110 has a cylindrical shape. Part of a lower end portion of the radiation shield 110 is provided with a small gap between the lower end portion of the radiation shield 110 and the surface of the radiation receiving object 50. The gap is configured to function as a discharge portion via which gases in the radiation shield 110 are discharged.

Figure 41:
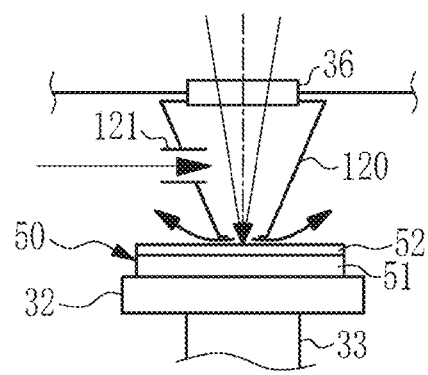
FIG. 41 shows a variation of a radiation shield.

The radiation shield does not necessarily have a cylindrical shape. A conical radiation shield 120 may be used in place of the cylindrical radiation shield 110, as shown in FIG. 41. The radiation shield 120 has a diameter that decreases toward the lower end thereof.

The radiation shield is not necessarily required, and the radiation receiving object 50 may be placed in a vacuum chamber for suppression of oxide generation.

In the embodiments described above, the OPS is provided in the laser apparatus, and the OPS is not necessarily required as long as the pulse period width of the pulsed laser light outputted from the laser apparatus falls within a range that allows the laser doping.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. A laser radiation system for laser doping and post-annealing, the laser radiation system comprising:
   A. a laser apparatus configured to generate pulsed laser light that belongs to an ultraviolet region;
   B. a stage configured to move a radiation receiving object in an at least one scan direction, the radiation receiving object being an impurity source film containing at least an impurity element as a dopant and formed on a semiconductor substrate; and
   C. an optical system including a beam homogenizer configured to shape a beam shape of the pulsed laser light into a rectangular shape and generate a beam for laser doping and a beam for post-annealing that differ from each other in terms of a first beam width in the scan direction but have the same second beam width perpendicular to the scan direction.

2. The laser radiation system according to claim 1, wherein the beam homogenizer is configured to selectively generate the beam for laser doping and the beam for post-annealing based on the pulsed laser light incident from the laser apparatus.

3. The laser radiation system according to claim 2, further comprising:
   D. a laser radiation controller configured to control the beam homogenizer to switch the beam for laser doping to the beam for post-annealing and vice versa.

4. The laser radiation system according to claim 3, wherein the beam homogenizer includes a first fly-eye lens for laser doping, a second fly-eye lens for post-annealing, and a first actuator configured to move the first and second fly-eye lenses, and
the laser radiation controller is configured to control the first actuator to selectively insert one of the first and second fly-eye lenses into an optical path of the pulsed laser light.

5. The laser radiation system according to claim 3, wherein the beam homogenizer includes a first cylindrical lens array, a second cylindrical lens array, and a third cylindrical lens array disposed in an optical path of the pulsed laser light and a second actuator configured to change a gap between the first cylindrical lens array and the second cylindrical lens array, and
the laser radiation controller is configured to cause the beam homogenizer to selectively generate the beam for laser doping and the beam for post-annealing by controlling the second actuator to control the gap to change the first beam width.

6. The laser radiation system according to claim 3,
wherein the first beam width Bdx of the beam for laser doping satisfies Expression (a) below, and the first beam width Bpx of the beam for post-annealing satisfies Expression (b) below, $$Bdx = Et/(Fd \cdot By) \quad \text{(a)}$$

$$Bpx = Et/(Fp \cdot By) \quad \text{(b)}$$

where Et represents pulse energy of the pulsed laser light, Fd represents first fluence for laser doping, Fp represents second fluence for post-annealing, and By represents the second beam width.

7. The laser radiation system according to claim 6,
wherein a first scan speed Vdx, which is a moving speed of the radiation receiving object in the scan direction in the laser doping satisfies Expression (c) below, and a second scan speed Vpx, which is a moving speed of the radiation receiving object in the scan direction in the post-annealing satisfies Expression (d) below, $$Vdx = f \cdot Bdx/Nd \quad \text{(c)}$$

$$Vpx = f \cdot Bpx/Np \quad \text{(d)}$$

where f represents a repetitive frequency of laser oscillation performed by the laser apparatus, Nd represents a first number of radiated pulses for laser doping, and Np represents a second number of radiated pulses for post-annealing.

8. The laser radiation system according to claim 1,
wherein the beam homogenizer is configured to generate the beam for post-annealing along with the beam for laser doping based on the pulsed laser light incident from the laser apparatus.

9. The laser radiation system according to claim 8,
wherein the stage is configured to move the radiation receiving object with the radiation receiving object irradiated with the beam for laser doping and the beam for post-annealing.

10. The laser radiation system according to claim 9,
wherein the stage is configured to move the radiation receiving object in such a way that a region irradiated with the beam for laser doping is shifted from a region irradiated with the beam for post-annealing toward a front side of the scan direction.

11. The laser radiation system according to claim 10,
wherein the optical system includes a beam splitter configured to reflect part of the pulsed laser light and transmit another part of the pulsed laser light,
the beam homogenizer includes a first beam homogenizer disposed in an optical path of the light having passed through the beam splitter and a second beam homogenizer disposed in an optical path of the light having reflected off the beam splitter, and
one of the first and second beam homogenizers is configured to generate the beam for laser doping, and another of the first and second beam homogenizers is configured to generate the beam for post-annealing.

12. The laser radiation system according to claim 11,
wherein the first beam homogenizer includes a first cylindrical lens array, a second cylindrical lens array, and a third cylindrical lens array disposed in an optical path of the pulsed laser light and a third actuator configured to change a gap between the first cylindrical lens array and the second cylindrical lens array, and
the second beam homogenizer includes a fourth cylindrical lens array, a fifth cylindrical lens array, and a sixth cylindrical lens array disposed in the optical path of the pulsed laser light and a fourth actuator configured to change a gap between the fourth cylindrical lens array and the fifth cylindrical lens array.

13. The laser radiation system according to claim 11,
wherein the beam splitter is configured to be capable of changing reflectance of light reflected off a region on which the pulsed laser light is incident.

14. The laser radiation system according to claim 13,
wherein the first beam homogenizer is used to perform the laser doping, the second beam homogenizer is used to perform the post-annealing, and a reflectance R is so set as to satisfy Expressions (d) to (f) below, $$\alpha = Fp/Fd \quad \text{(d)}$$

$$\beta = Np/Nd \quad \text{(e)}$$

$$R = \alpha \cdot \beta/(1+\beta) \quad \text{(f)}$$

where Fd represents first fluence for laser doping, Fp represents second fluence for post-annealing, Nd represents a first number of radiated pulses for laser doping, and Np represents a second number of radiated pulses for post-annealing.

15. The laser radiation system according to claim 14,
wherein the first beam width Bdx of the beam for laser doping satisfies Expression (g) below, and the first beam width Bpx of the beam for post-annealing satisfies Expression (h) below, $$Bdx = (1-R)Et/(Fd \cdot By) \quad \text{(g)}$$

$$Bpx = R \cdot Et/(Fp \cdot By) \quad \text{(h)}$$

where Et represents pulse energy of the pulsed laser light and By represents the second beam width.

16. The laser radiation system according to claim 15,
wherein a scan speed Vx, which is a moving speed of the radiation receiving object, satisfies Expression (i) below $$Vx = f \cdot Bdx/Nd \quad \text{(i)}.$$

17. The laser radiation system according to claim 13,
wherein the second beam homogenizer is used to perform the laser doping, the first beam homogenizer is used to perform the post-annealing, and a reflectance R is so set as to satisfy Expressions (j) to (l) below, $$\alpha = Fd/Fp \quad \text{(j)}$$

$$\beta = Nd/Np \quad \text{(k)}$$

$$R = \alpha \cdot \beta/(1+\beta) \quad \text{(l)}$$

where Fd represents first fluence for laser doping, Fp represents second fluence for post-annealing, Nd represents a first number of radiated pulses for laser doping, and Np represents a second number of radiated pulses for post-annealing.

18. The laser radiation system according to claim 17,
wherein the first beam width Bdx of the beam for laser doping satisfies Expression (m) below, and the first beam width Bpx of the beam for post-annealing satisfies Expression (n) below, $$Bdx = R \cdot Et/(Fd \cdot By) \quad \text{(m)}$$

$$Bpx = (1-R)Et/(Fp \cdot By) \quad \text{(n)}$$

where Et represents pulse energy of the pulsed laser light and By represents the second beam width.

19. The laser radiation system according to claim 18, wherein a scan speed Vx, which is a moving speed of the radiation receiving object, satisfies Expression (o) below $$Vx = f \cdot Bdx/Nd \qquad (o).$$

* * * * *